(12) United States Patent
Merritt et al.

(10) Patent No.: US 8,291,935 B1
(45) Date of Patent: Oct. 23, 2012

(54) FLEXIBLE GAS MIXING MANIFOLD

(75) Inventors: Neil J. Merritt, San Jose, CA (US);
Kevin D. Jennings, Morgan Hill, CA (US); George A. Gilbert, Fremont, CA (US); David E. Bowser, Los Gatos, CA (US); Sooyun Joh, Livermore, CA (US)

(73) Assignee: Novellus Systems, Inc., San Jose, CA (US)

( * ) Notice: Subject to any disclaimer, the term of this patent is extended or adjusted under 35 U.S.C. 154(b) by 854 days.

(21) Appl. No.: 12/384,623

(22) Filed: Apr. 7, 2009

(51) Int. Cl.
*F16K 11/20* (2006.01)

(52) U.S. Cl. ............ 137/597; 137/897; 438/935

(58) Field of Classification Search .......... 137/594, 137/597, 9, 637, 896, 897, 605, 606, 607; 438/935
See application file for complete search history.

(56) References Cited

U.S. PATENT DOCUMENTS 6,962,268 B2 * 11/2005 Bruat et al. ............ 137/897
7,775,236 B2 * 8/2010 Gold et al. ............ 137/597

* cited by examiner

Primary Examiner — Eric Keasel

(57) ABSTRACT

Each of plurality of gas sources flows to a different one of a plurality of separate source gas flow paths. Then, a source gas is distributed directly from each of plurality of separate source gas flow paths to a plurality of separate gas mixture flow paths, thereby distributing a plurality of source gases to each of different flow paths. A plurality of separate gas mixture streams is generated by flowing a plurality of source gases in each of a plurality of separate gas mixture flow paths. In some embodiments, each of a plurality of separate source gas flow paths comprises a gas distribution duct, and each of a plurality of gas mixture flow paths comprises a gas mixing conduit. In some embodiments, a gas distribution duct includes a plurality of gas distribution ports and a gas source port connectable to a gas source. In some embodiments, a gas mixing conduit comprises a plurality of gas inlet holes, a gas mixing region, and a gas outlet hole. Each of the gas inlet holes is connectable to a gas distribution duct and is operable to conduct a source gas into the gas mixing region. A plurality of gases is mixed in the mixing region to form a gas mixture. A gas manifold is operable to mix a plurality of source gases in a plurality of gas mixing conduits to generate a plurality of gas mixtures having different gas compositions and flow rates.

17 Claims, 23 Drawing Sheets

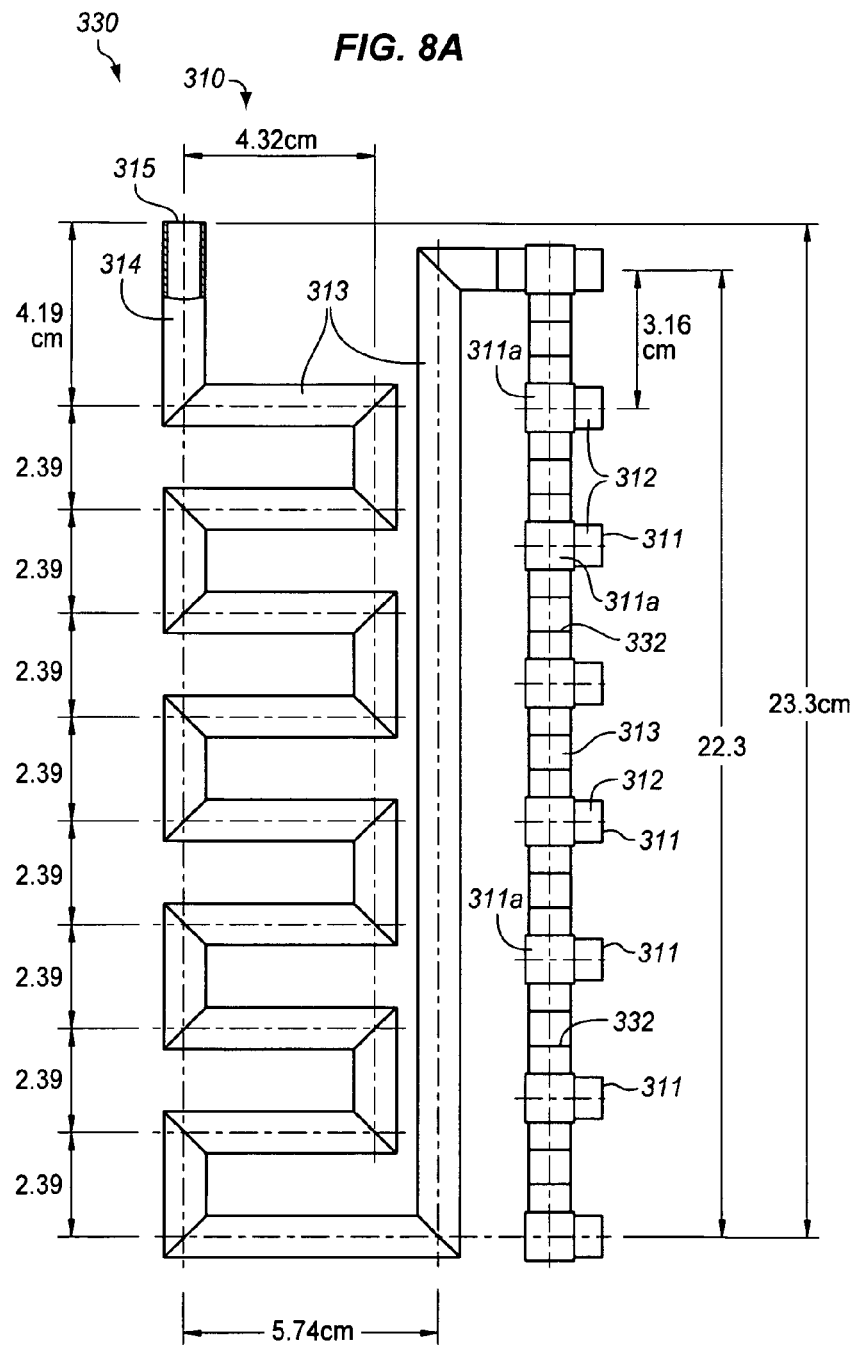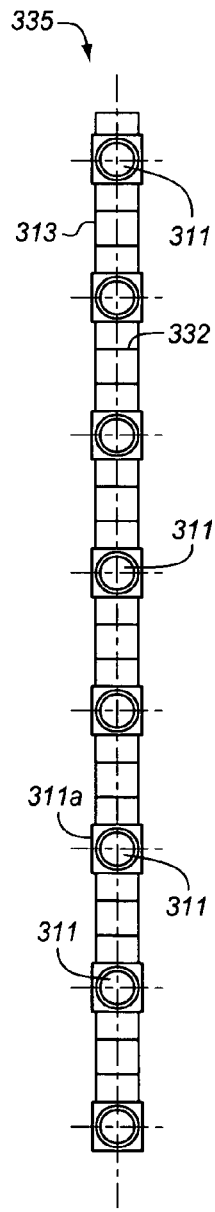
*FIG. 8A*
*FIG. 8B*

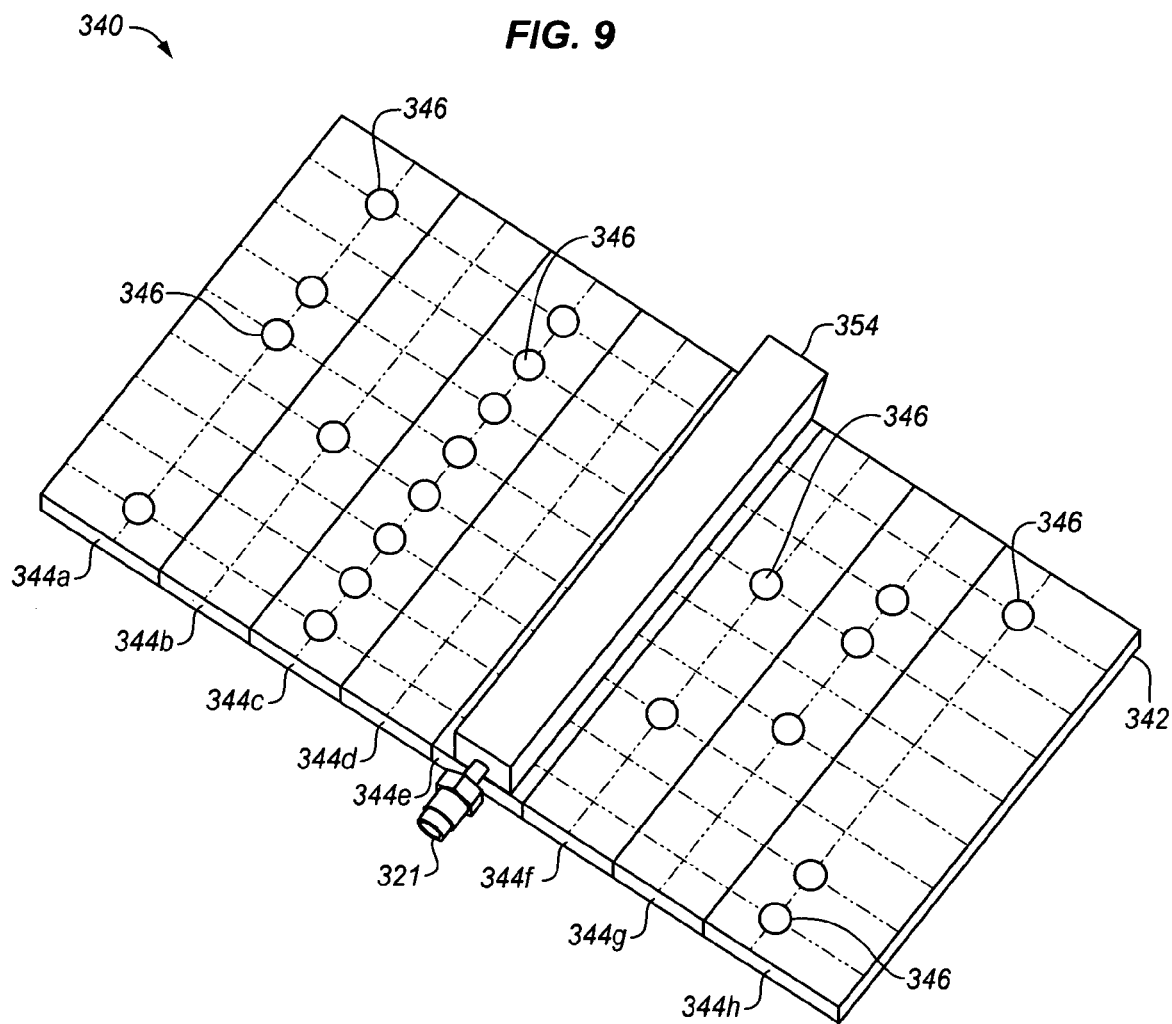

FLEXIBLE GAS MIXING MANIFOLD

FIELD OF THE INVENTION

The present invention pertains to the field of gas manifolds, particularly to systems and methods for delivering gas mixtures to one or more semiconductor wafer processing stations.

BACKGROUND OF THE INVENTION

Integrated circuits are formed on wafers by well-known processes and materials. These processes typically include supplying a gas stream containing one or more gases to a semiconductor processing apparatus. Exemplary gases comprise reactant gases, carrier gases, diluent gases, and purge gases. Except for purge gas, a gas stream supplied to a semiconductor processing apparatus often includes two or more reactant gases and one or more carrier and diluent gases. In some applications, however, when one or more reactant gases should not be combined outside of a reaction chamber, two or more separate streams having different compositions are sent to the semiconductor processing apparatus. There is, therefore, a need for a flexible gas manifold for delivering two or more gas streams having different compositions and gas flow rates to a semiconductor processing system. Similarly, there is a need for delivering a gas stream having a first composition and flow rate, followed by a gas stream having a different composition and flow rate using the same gas delivery system.

Over the years, multistation semiconductor processing systems have been designed; that is, semiconductor processing systems that include a plurality of semiconductor processing stations or processing chambers. Therefore, there is a need for a gas delivery system that can provide a plurality of gas streams having a first composition and flow rate uniformly to a corresponding plurality of processing stations, and thereafter provide a plurality of different gas streams having a different composition and flow rate with the same uniformity to the processing stations.

In some semiconductor processing systems and processes, the plurality of processing stations are utilized at least sometimes under processing conditions that differ from one station to another. In some of these systems and processes, a semiconductor wafer is passed within a multistation system from one station to another, and different processes are performed at different stations. In such applications, it is common for a processing gas (a single gas or a gas mixture) supplied to one station to be different from the processing gas supplied to one or more other stations. For example, the total gas flow rate and gas mixture composition of a gas stream supplied to one semiconductor processing station may be different in one or more aspects from the gas flow rate and composition of gas streams supplied to other stations of the multistation system. In some of these multistation systems, two or more wafer processing stations are located in the same reaction chamber, but gas streams supplied to the individual wafer processing stations are not identical. In some of the multistation systems, one or more wafers are processed in each of several processing chambers that are located in a single apparatus or processing tool or system, and gas streams having different compositions are sent to the different chambers, or to different processing stations within a particular chamber. In some applications, therefore, it would be useful if a gas manifold could be used to provide gas streams having different flow rates and compositions to a plurality of semiconductor processing apparatuses. Since the same substrate processing apparatus is sometimes used for different phases of substrate processing, and since a particular processing apparatus is typically used under completely different process conditions for different types of substrates, there is a need for a gas delivery system that is flexible enough to provide a plurality of gas streams having desired gas compositions and flow rates according to different requirements.

Gas delivery systems are known in the field of semiconductor processing for supplying gas streams of different compositions. FIG. 1 contains a pictorial representation of an exemplary manifold system 100 as might be used in the prior art for delivering two different gas mixtures to five wafer processing stations. System 100 comprises a gas box 102 and a gas distribution section 104. System 100 comprises manual gas valves 106, gas filters 108, on-off gas ports 110, and mass flow controllers 112, as known in the art and located in gas box 102. System 100 further comprises shared gas tube 114, shared gas tube 116, gas mixers 118, gas distribution tube 120, gas distribution tube 121, gas flow restrictors 122 and gas output tubes 124, as known in the art. System 100 further comprises a plurality of threaded joints 126 and welded joints 128 for connecting gas tubes. System 100 is operable to deliver gas through gas mixing output tubes 124 containing the gas mixture flowing through shared gas mixture tube 114, the gas mixture flowing through shared gas mixture tube 116, or a gas mixture containing combined gas mixtures flowing through shared gas mixture tube 114 and shared gas mixture tube 116. System 100 has, therefore, limited flexibility. FIG. 2 depicts schematically the gas flow scheme of gas (delivery) manifold system 100. FIG. 2 depicts gas box enclosure 102 and gas delivery section 104. FIG. 2 further depicts manual gas valves 106, gas filters 108, gas ports 110, and mass flow controllers 112. FIG. 2 further depicts shared gas mixture tube 114, shared gas mixture tube 116, gas delivery tube 120, gas delivery tube 121, gas flow restrictors 122 and gas mixing output tubes 124, as known in the art. System 100 further comprises a plurality of threaded joints and welded joints for connecting gas tubes.

FIG. 3 depicts schematically the gas flow scheme of an exemplary manifold system 200 as used in the prior art for supplying different mixtures of gases to a plurality of wafer processing stations. As depicted in FIG. 3, manifold system 200 comprises a gas box 202 as known in the art and a gas delivery section 204. System 200 further comprises manual gas valves 206, gas filters 208, on-off gas ports 210, and mass flow meters 212, as known in the art and located in gas box 202. System 200 further comprises gas input tubes 220 and splittable gas input tubes 222, 223. System 200 further comprises shared gas mixture delivery tube 230, gas delivery tubes 231, on-off valves 232, mass flow meters 234 and gas output tubes 236, as known in the art and located in gas delivery section 204. Through selective use of on-off valves 210 in gas input tubes 220 and on-off valves 211 in splittable gas input tubes 222, 223, together with on-off valves 232 in gas mixture delivery tube 230 and gas delivery tubes 231, system 200 is operable to provide limited flexibility in the compositions of gas mixtures flowing to wafer processing stations 2-6. In system 200, the gas mixture compositions are flexible in the sense that the total flow rates of $H_2$ and $N_2$ to a particular station can be selected to be a first flow rate, a second flow rate, a third flow rate or zero flow rate. Similarly, the flow rate of $CF_4$ to a particular station can be selected to be a first flow rate, a second flow rate or zero. The flow rates of $O_2$, $N_2$, $CO_2$ and Ar, however, are limited to either one flow rate or zero. FIG. 4 contains a pictorial view 240 of gas manifold system 200 as practiced in the prior art. Pictorial view 240 shows gas box section 202 and gas delivery section 204. View 240 further shows on-off gas ports 210, 211 and mass flow meters 212, as known in the art and located in gas box 202. View 240 further shows gas input tubes 220. View 240 further shows shared gas mixture delivery tube 230 and gas delivery tubes 231, on-off valves 232, mass flow restrictors 233, mass flow meters 234, gas mixer 235 and gas output tubes 236. View 240 further shows numerous threaded joints 242 and welded joints 246 that connect various sections of gas tubing together.

Comparison of exemplary system 100 depicted in FIGS. 1 and 2, on the one hand, with system 200 depicted in FIGS. 3 and 4, on the other hand, indicates the large increase in system complexity and expense caused by the extra but limited flexibility of system 200 compared with system 100. The design of a system 200 is considerably more complicated and time-consuming and, therefore, more expensive than the design of a system 100. The extra expense of additional mass flow controllers, gas valves, and threaded and welded joints for more tube connections adds considerable expense as systems become more complex. Since the gas flows and pressure drops across valves, tube connections and angled (e.g. 90°) tube joints are difficult to model and to calculate, the actual performance of the systems becomes less predictable as complexity increases, especially for systems in which gas flow rates vary from one use application to another. In some environments, tube connections and joints cause and collect solid deposits. As systems become larger and more complex, cleaning the systems becomes more difficult, expensive and time-consuming. As systems become larger and more complex, the residence times of gases in a system increase correspondingly (with a simultaneous decrease in conductance). Also, the occurrence of so-called "dead spaces" increases with system complexity. As residence times of gases increase, the time for a gas delivery system to reach steady-state required for wafer processing also increases, leading to an overall decrease in wafer throughput. This is especially true when a gas in a gas mixture has a very low concentration compared to other gases, for example, a volumetric concentration of 0.5% of the total volumetric flow rate. A related problem of complex manifolds is the decrease in the efficiency of mixing several gases in several gas streams so that the desired compositions are delivered to wafer processing stations. Additionally, as the number of tubes, tube connections, and valves increases, the difficulty of system purging increases. Dead spaces and purging difficulty can lead to the formation of particles which can cause defects on the work piece.

Despite increased design costs and time, increased capital costs, and increasing problems regarding technical performance of gas manifold systems that provide increased gas delivery flexibility, the demand and need for such systems has increased over the years. For example, semiconductor process and product development facilities are constantly trying different gas mixtures to improve performance of semiconductor processing methods and equipment. Also, as in research and development fabrication facilities, so-called "boutique" semiconductor fabrication facilities require flexibility of gas compositions in order to use the same semiconductor processing tool for various semiconductor fabrication jobs. A common problem in the prior art is that a gas delivery system designed for a particular set of requirements is unsuitable for providing gas streams under different requirements of composition and flow rate.

Thus, there is a need in the field of semiconductor wafer processing for gas manifold systems that are economically and technically viable and that are able to deliver a plurality of gas streams having different gas mixtures to one or more wafer processing stations simultaneously and sequentially according to a variety of process requirements.

SUMMARY OF THE INVENTION

The present invention helps to solve some of the problems outlined above by providing methods and systems for designing, building and using gas manifold systems that are operable to provide a plurality of gas mixtures having different gas flow rates and gas compositions to one or more semiconductor wafer processing stations. The invention is described herein mainly with reference to manifold systems for delivery of a plurality of streams of gas mixtures having different total flow rates and different compositions (e.g., different partial pressures of individual gases in a mixture) to a plurality of semiconductor wafer processing stations in a semiconductor wafer processing apparatus. It is understood, however, that methods and systems in accordance with the invention are also useful for any application requiring the delivery of multiple streams of gas mixtures in which the gas flow rates and relative proportions (gas partial pressures) of various components of the mixtures are not identical in all gas streams.

One embodiment of a gas manifold in accordance with the invention comprises: a plurality of gas distribution ducts, each distribution duct comprising a gas source port that is connectable to a gas source, and each gas distribution duct comprising at least one gas distribution port; and a plurality of gas mixing conduits, each of a plurality of the gas mixing conduits comprising a plurality of gas inlet holes, a gas mixing region, and a gas outlet hole. In each gas mixing conduit, the gas inlet holes lead into the gas mixing conduit toward the gas mixing region, the gas mixing region leads toward the gas outlet hole, and the gas outlet hole leads out of the gas mixing conduit. Each of a plurality of the gas inlet holes is connectable to one of the gas distribution ports. Typically, each gas outlet hole is connectable to a substrate processing station in a substrate processing system. In some embodiments, each of the gas mixing conduits is operable: to receive a plurality of source gases by receiving a single source gas from each of a plurality of the gas distribution ducts through each of a plurality of corresponding gas inlet holes; to mix the plurality of source gases to generate a gas mixture; and to provide the gas mixture through the gas outlet hole, for example, to a substrate processing station. In preferred embodiments, each of a plurality of the gas distribution ducts is operable to distribute a single source gas to a plurality of the gas mixing conduits. In some preferred embodiments, the gas manifold is operable: to provide a gas mixture in a gas mixture stream from one, a plurality or all of the gas mixing conduits to a substrate processing station without combining the gas mixture stream with another gas stream. In some preferred embodiments, the gas manifold is operable: to provide the gas mixture in the gas mixture stream from one, a plurality or all of the gas mixing conduits to the substrate processing station without splitting the gas mixture stream. In some preferred embodiments, the gas manifold is operable: to generate a gas mixture in each of a plurality of the gas mixing conduits using only source gases from a plurality of the gas distribution ducts delivered through the gas inlet holes; and to provide the gas mixture of one, a plurality or all gas mixture streams to a substrate processing station without splitting the gas mixture stream. In some embodiments, one or more of the gas mixing conduits are operable to provide the gas mixture in a gas mixture stream to a semiconductor wafer processing station. In some embodiments, the plurality of gas mixing conduits comprises m-number of gas mixing conduits, each of the m-number of gas mixing conduits comprises n-number of gas inlet holes, the plurality of gas distribution ducts comprises n-number of gas distribution ducts, and each of the n-number of gas distribution ducts includes m-number of gas distribution ports, each gas distribution port being connectable to one of m×n gas inlet holes. In some of these embodiments, the gas manifold further comprises a plurality of gas inlet valves, each gas inlet valve being operable to control gas flow of a source gas through a gas distribution port. Thus, a gas inlet valve is operable to control flow of a source gas from a gas distribution duct to a gas inlet hole of a gas mixing conduit. In some preferred embodiments, gas inlet valves are surface mounted valves. In some embodiments, the plurality of gas mixing conduits comprises m-number of gas mixing conduits, each of the m-number of gas mixing conduits comprises n-number of gas inlet holes, the plurality of gas distribution ducts comprises n-number of gas distribution ducts, and each of the n-number of gas distribution ducts includes m-number of gas distribution ports. In such embodiments, each gas distribution port is connectable to one of up to m×n gas inlet valves. In some preferred embodiments, the gas mixing region in each of a plurality of the gas mixing conduits includes no welded joint. In some preferred embodiments, the gas mixing region in each of a plurality of the gas mixing conduits includes no threaded joint. In some preferred embodiments, the gas mixing region in each of a plurality of the gas mixing conduits includes only one flow channel, wherein the flow channel has no intersections with another gas flow channel. In some preferred embodiments, at least a portion of a gas mixing region of one, a plurality or all of the gas mixing conduits has a serpentine shape. In some embodiments, each of a plurality of the gas distribution ducts comprises only one flow channel, wherein the flow channel has no intersections with another gas flow channel. In some embodiments, each of a plurality of the gas mixing conduits comprises only one flow channel, wherein the flow channel has no intersections with another gas flow channel. In some embodiments having a plurality of station mixture flow paths, each station mixture flow path connects a gas outlet hole of only one of the gas mixing conduits to a substrate processing station, wherein the station mixture flow path comprises only one flow channel, and wherein the flow channel has no intersections with another gas flow channel. In some preferred embodiments, the gas outlet hole of each of a plurality of the gas mixing conduits is connectable to only one substrate processing station in a substrate processing system.

A generalized embodiment of a gas manifold in accordance with the invention comprises: a gas distribution section including a plurality of separate source gas flow paths; and a gas mixing section including a plurality of separate gas mixture flow paths. Each gas mixture flow path is connectable to one, a plurality or all of the source gas flow paths. The gas distribution section is operable to distribute a source gas from each of a plurality of the separate source gas flow paths to each of a plurality of the separate gas mixture flow paths without combining source gases from different source gas flow paths except in the gas mixture flow paths. The gas mixing section is operable to mix a plurality of source gases in each of a plurality of the separate gas mixture flow paths to generate a plurality of separate gas mixtures. In some preferred embodiments, the gas mixing section is operable to provide a gas mixture in a gas mixture stream in one, a plurality or all of the gas mixture flow paths to a substrate processing station without combining the gas mixture stream with another gas stream. In some preferred embodiments, the gas mixing section is operable to provide the gas mixture in the gas mixture stream in one, a plurality or all of the gas mixture flow paths to a substrate processing station without splitting the gas mixture stream. In some preferred embodiments, each separate source gas flow path receives input from only one gas source, and each gas mixture flow path receives input only from one, a plurality or all source gas flow paths, and preferably not from other gas streams. In some preferred embodiments, the gas manifold is operable to provide a gas mixture in a gas mixture stream in one, a plurality or all of the gas mixture flow paths to a substrate processing station without combining the gas mixture stream with another gas stream. In some preferred embodiments, the gas mixing section of one or more gas mixing conduits is operable to provide the gas mixture in the gas mixture stream in the at least one of the gas mixture flow paths to a substrate processing station without splitting the gas mixture stream. In some preferred embodiments, each of a plurality of the separate source gas flow paths in the gas distribution section includes a gas distribution duct, wherein the gas distribution duct comprises a gas source port that is connectable to a gas source, and the gas distribution duct comprises at least one gas distribution port. In such preferred embodiments, each of a plurality of the separate gas mixture flow paths includes a gas mixing conduit.

In some preferred embodiments, a gas manifold comprises: a grooved block of material, and the grooved block includes interconnected grooves that form a gas mixing conduit. The gas mixing conduit comprises a plurality of gas inlet holes, a gas mixing region, and a gas outlet hole. The gas inlet holes lead into the gas mixing conduit toward the gas mixing region, the gas mixing region leads toward the gas outlet hole, and the gas outlet hole leads out of the gas mixing conduit. Each of a plurality of the gas inlet holes is connectable to a gas source. Typically, a gas outlet hole is connectable to a substrate processing station. A gas mixing conduit is operable to receive a plurality of source gases at the gas inlet holes, to mix the plurality of source gases to generate a gas mixture, and to provide the gas mixture at the gas outlet hole. In some preferred embodiments, a gas manifold further comprises a plurality of gas inlet valves, each of a plurality of the gas inlet valves being operable to control a flow of gas through a gas inlet hole into corresponding gas inlet regions, which lead to the gas mixing region. In some preferred embodiments, the gas inlet valves are surface mounted valves. In some preferred embodiments, the grooves are machined grooves. In some embodiments, the grooved block of material comprises a plurality of plates, at least one of the plates includes interconnected grooves, the plates are joined together, and the interconnected grooves form the gas mixing conduit within the joined together plates. In some embodiments, the plurality of plates comprises two grooved plates, and grooves in each of the two grooved plates comprise substantially one half of a gas mixing conduit. In some preferred embodiments, the gas mixing region includes no welded joints. In some preferred embodiments, the gas mixing region includes no threaded joints. In some preferred embodiments, at least a portion of the gas mixing region has a serpentine shape. In some preferred embodiments, the grooved block is operable to function as a gas-conduit module in a gas manifold that is operable to deliver a plurality of gas mixture streams having different compositions.

Some preferred embodiments of a gas manifold operable to provide a plurality of different gas mixtures comprises: a grooved block of material, the grooved block of material including grooves that form a plurality of gas mixing conduits. Each of the gas mixing conduits comprises a plurality of gas inlet holes, a gas mixing region, and a gas outlet hole. In each gas mixing conduit, the plurality of gas inlet holes lead into the gas mixing conduit toward the gas mixing region, the gas mixing region leads toward the gas outlet hole, and the gas outlet hole leads out of the gas mixing conduit. Each of a plurality of the gas inlet holes is connectable to a gas source, and each gas outlet hole is connectable to a substrate processing station in a substrate processing system. Each of a plurality of the gas mixing conduits is operable: to receive a plurality of source gases by receiving a single source through each of a plurality of corresponding gas inlet holes; to mix the plurality of source gases to generate a gas mixture; and to provide the gas mixture through the gas outlet hole. In some embodiments, the block of grooved material comprises a plurality of plates, at least one of the plates includes interconnected grooves, and the grooved plates are joined together to form the plurality of gas mixing conduits. In some embodiments, a gas manifold further comprises a plurality of gas distribution ducts. Each of the gas distribution ducts comprises a gas source port that is connectable to a gas source, and each of the gas distribution ducts comprises at least one gas distribution port, each gas distribution port being connectable to a gas inlet hole. Some embodiments further comprise a plurality of gas inlet valves. In such embodiments, each gas inlet valve controls gas flow of a source gas through a gas distribution port of a gas distribution duct to a gas inlet hole of a gas mixing conduit. In some embodiments, the gas inlet valves are surface mounted valves. In some embodiments, the plurality of gas mixing conduits comprises m-number of gas mixing conduits, each of the m-number of gas mixing conduits comprises n-number of gas inlet holes, the plurality of gas distribution ducts comprises n-number of gas distribution ducts. Each of the n-number of gas distribution ducts includes m-number of gas distribution ports, and each gas distribution port is connectable to one of m×n gas inlet valves, so that gas flow of a source gas to each gas inlet hole is controlled by one of m×n gas inlet valves. In some embodiments, the block of grooved material includes grooves that form a plurality of gas distribution ducts. In some embodiments, the grooves forming the gas distribution ducts include no welded joints. In some embodiments, the grooves forming the gas distribution ducts include no threaded joints. In some embodiments, each of a plurality of the gas distribution ducts comprises only one flow channel, wherein the flow channel has no intersections with another gas flow channel. In some embodiments, the plurality of gas mixing conduits comprises m-number of gas mixing conduits, each of the m-number of gas mixing conduits comprises n-number of gas inlet holes, the plurality of gas distribution ducts comprises n-number of gas distribution ducts, and each of the n-number of gas distribution ducts includes m-number of gas distribution ports, each gas distribution port being connectable to one of m×n gas inlet holes. In some embodiments, the gas mixing region in each of a plurality of gas mixing conduits formed by the grooves include no welded joints. In some embodiments, the gas mixing region in each of a plurality of gas mixing conduits formed by the grooves includes no threaded joints. In some embodiments, the gas mixing regions in each of a plurality of gas mixing conduits formed by the grooves include no threaded joints. In some embodiments, each of a plurality of the gas mixing conduits comprises only one flow channel, wherein the flow channel has no intersections with another gas flow channel. In some embodiments, at least a portion of a gas mixing region of one, a plurality or all of the gas mixing conduits has a serpentine shape. In some embodiments, at least one of the gas mixing conduits includes an orifice plate. In some embodiments, at least one of the gas mixing conduits includes a geometrical dimension that is different from a geometrical dimension in another of the gas mixing conduits. In some embodiments, the gas manifold is operable to provide each of m-number of gas mixtures to one of m-number of substrate processing stations in a substrate processing system. In some embodiments, each of a plurality of gas distribution ducts is operable to distribute a single source gas to a plurality of the gas mixing conduits. In some embodiments, the gas manifold is operable to provide a gas mixture from one, a plurality or all of the gas mixing conduits to a substrate processing station without combining the gas mixture with other gas streams. In some embodiments, the gas manifold is operable: to generate a gas mixture in each of a plurality of the gas mixing conduits using only source gases from a plurality of the gas distribution ducts delivered through the gas inlet holes; and to provide the gas mixture in a gas mixture stream from a plurality or all of the gas mixing conduits to a substrate processing station without splitting the gas mixture stream. In some embodiments, the gas manifold is operable to provide the gas mixture in a gas mixture stream from a plurality or all of the gas mixing conduits to a substrate processing station without combining the gas mixture stream with another gas stream. In some embodiments, the gas manifold is operable to provide the gas mixture in a gas mixture stream to a semiconductor wafer processing station.

A generalized method in accordance with the invention of providing a plurality of separate gas mixture streams comprises: flowing a plurality of source gases to a plurality of separate gas mixture flow paths by flowing each of plurality of source gases through a different one of a plurality of separate source gas flow paths; distributing a plurality of the source gases to the plurality of separate gas mixture flow paths by distributing a source gas directly from each of a plurality of the separate source gas flow paths to a plurality of the separate gas mixture flow paths; and generating a plurality of separate gas mixture streams by flowing a plurality of source gases in each of a plurality of the separate gas mixture flow paths. In some embodiments, the plurality of separate gas mixture flow paths comprises m-number of separate gas mixture flow paths; each of the m-number of separate gas mixture flow paths comprises n-number of source gas inlets; the plurality of separate source gas flow paths comprises n-number of separate source gas flow paths; and each of the n-number of separate source gas flow paths includes m-number of gas distribution ports. Each gas distribution port is connectable to one of m×n source gas inlets of the plurality of separate source gas flow paths. In some embodiments, flowing a plurality of source gases to a plurality of separate gas mixture flow paths does not include combining source gases from different source gas flow paths except in the gas mixture flow paths. In some embodiments, distributing a plurality of the source gases to a plurality of separate gas mixture flow paths by distributing a source gas directly from a plurality of the separate source gas flow paths to a plurality of the separate gas mixture flow paths does not include combining source gases from different source gas flow paths except in the gas mixture flow paths. Some embodiments further comprise flowing a plurality or all of the separate gas mixture streams through a corresponding plurality of the gas mixture flow paths to at least one substrate processing station without combining any of the separate gas mixture streams with another gas stream. Some embodiments further comprise flowing a plurality of separate gas mixture streams through a corresponding plurality of the gas mixture flow paths to at least one substrate processing station without splitting any of the separate gas mixture streams. Some embodiments further comprise flowing a plurality of separate gas mixture streams through a corresponding plurality of the gas mixture flow paths to at least one substrate processing station without splitting any of the separate gas mixture streams. In some embodiments, the plurality of gas distribution ducts comprises n-number of gas distribution ducts, and each of the n-number of gas distribution ducts includes m-number of gas distribution ports, each gas distribution port being connectable to one of m×n gas inlet holes.

An exemplary method of designing a gas manifold for flexible distribution of up to m-number of gas mixtures having up to n-number of gases to a substrate processing system comprises: selecting a desired gas flow rate and a desired gas partial pressure of each of up to n-number of gases in each of up to m-number of gas mixtures; using a mathematical model of a manifold, calculate geometrical dimensions of each of m-number of gas mixing conduits, wherein the mathematical model includes up to n-number of gases, wherein geometrical dimensions of gas mixing conduits in the model are variable, wherein the mathematical model is operable to calculate pressure drops through the gas mixing conduits, and wherein the mathematical model does not calculate a pressure drop across welded joints and threaded joints in the gas mixing conduits. Some embodiments further comprise calculating geometrical dimensions of each of n-number of gas distribution ducts for supplying the n-number of gases to the gas mixing conduits, wherein the mathematical model is operable to calculate pressure drops through the gas distribution ducts, and wherein the mathematical model does not calculate a pressure drop across welded joints and threaded joints in the gas distribution ducts.

Other features, characteristics and advantages of embodiments in accordance with the invention will become apparent in the detailed description below.

BRIEF DESCRIPTION OF THE DRAWINGS

FIG. 8A depicts schematically a cross-sectional view of one of six identical gas mixing conduits with reference to FIGS. 5 and 6;

FIG. 8B depicts schematically a plan view of gas inlet holes and a gas inlet section of the gas mixing conduit depicted in FIG. 8A;

FIG. 9 depicts schematically a mounting plate in accordance with the invention;

DETAILED DESCRIPTION OF THE INVENTION

Figure 1:
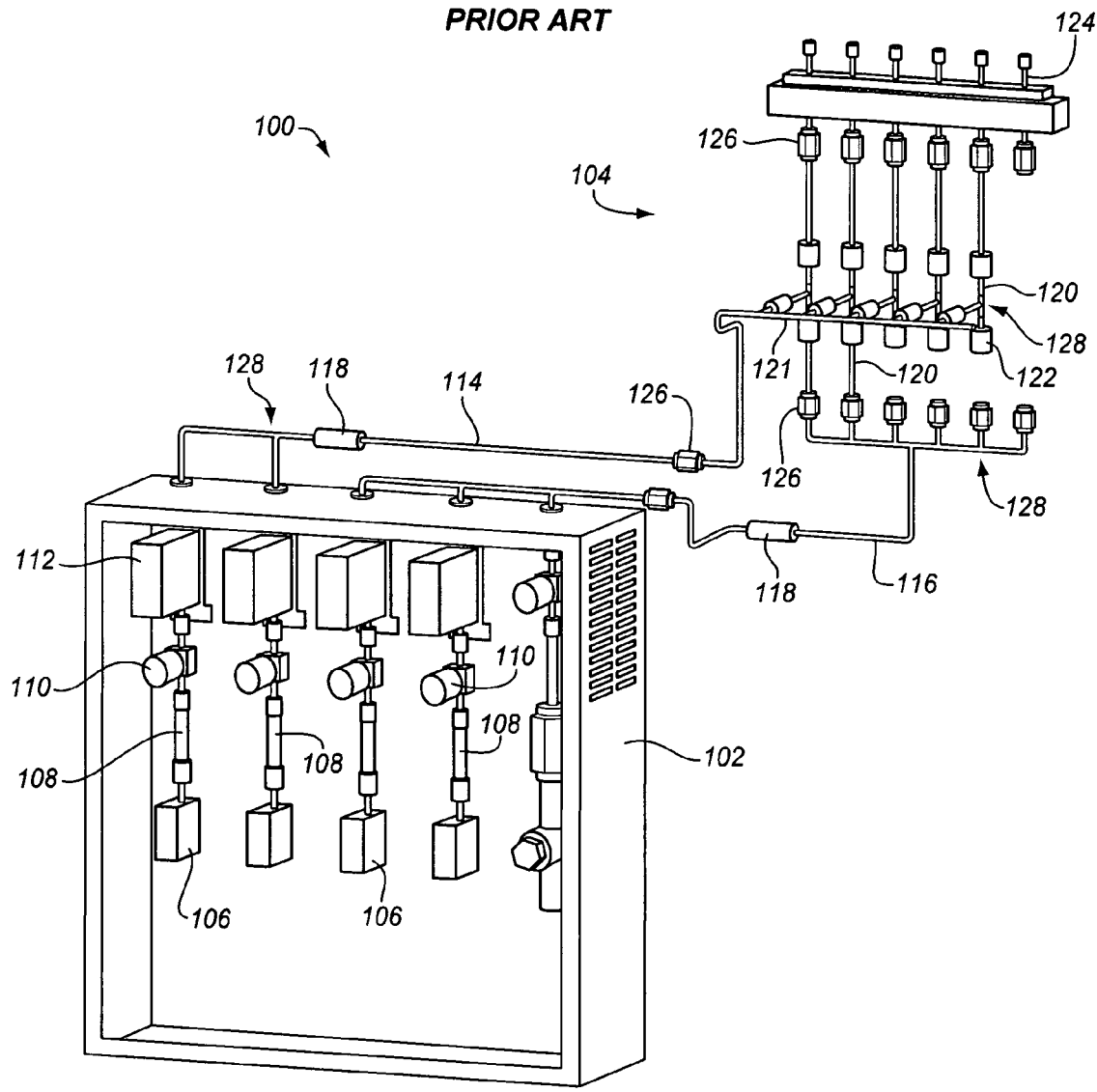
FIG. 1 contains a pictorial representation of an exemplary manifold system of the prior art for delivering two different gas mixtures to five wafer processing stations.
Figure 2:
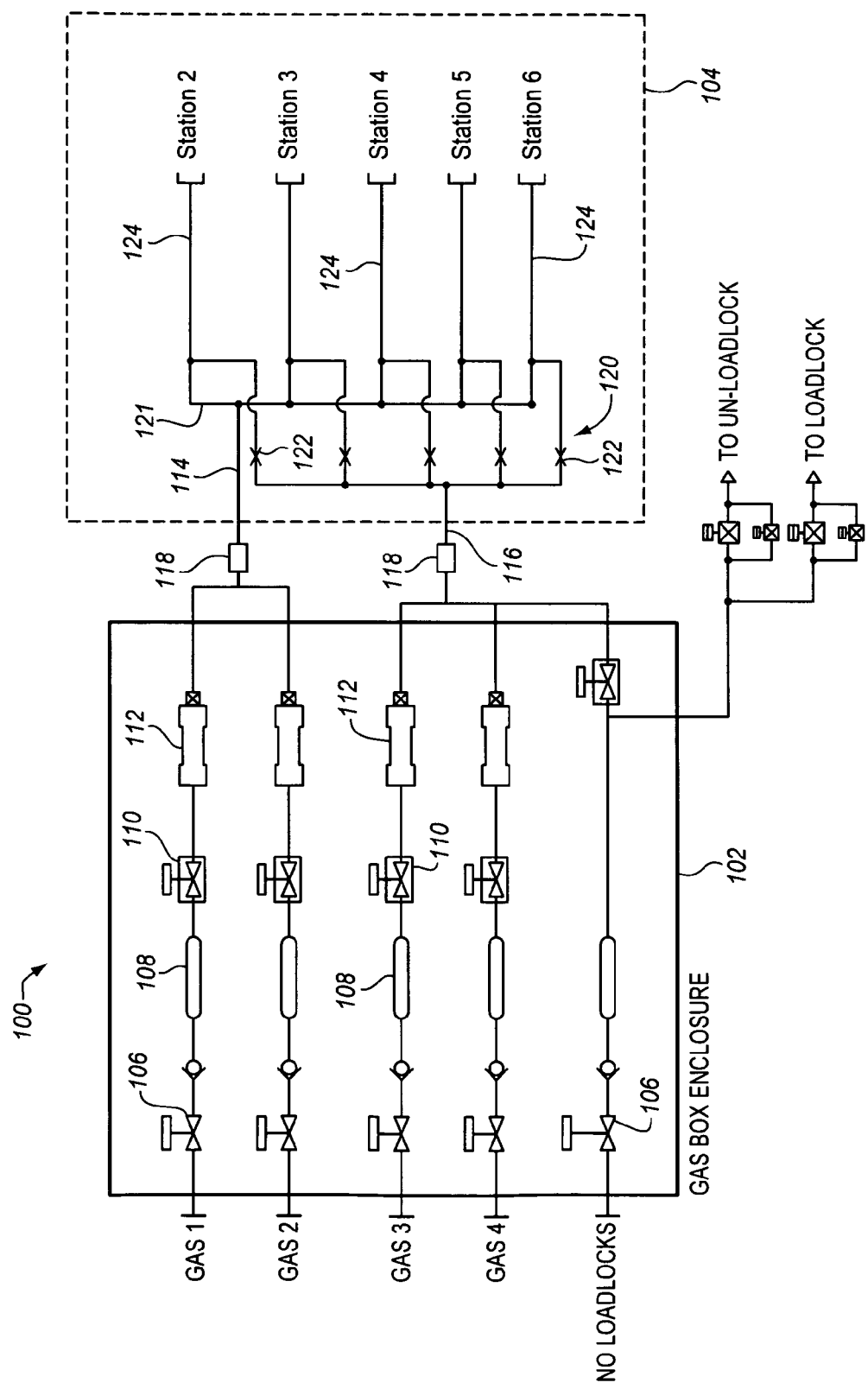
FIG. 2 depicts schematically the gas flow scheme of the gas delivery system of the prior art shown in FIG. 1.
Figure 3:
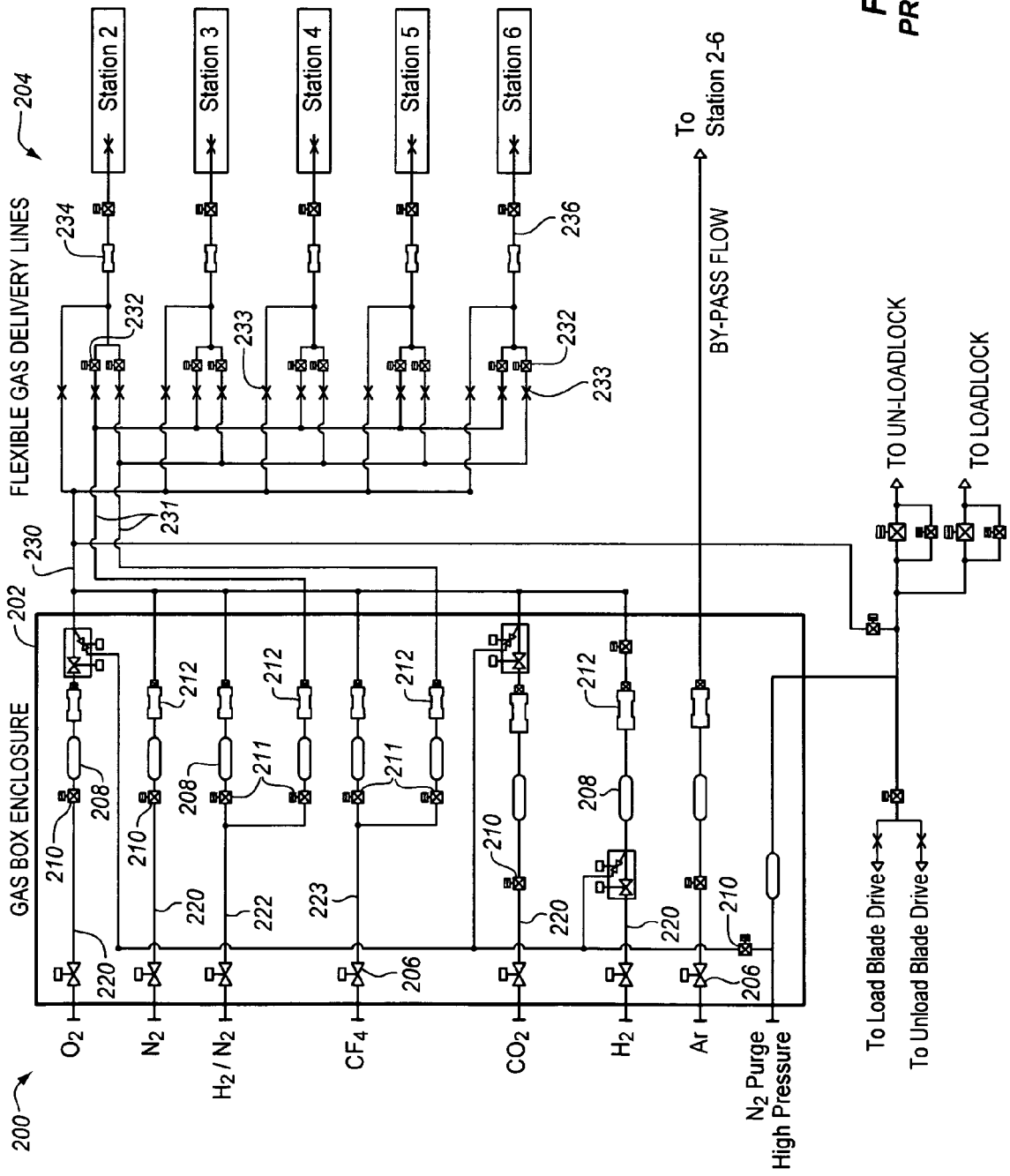
FIG. 3 depicts schematically the gas flow scheme of an exemplary manifold system of the prior art for supplying different mixtures of gases to a plurality of wafer processing stations.
Figure 4:
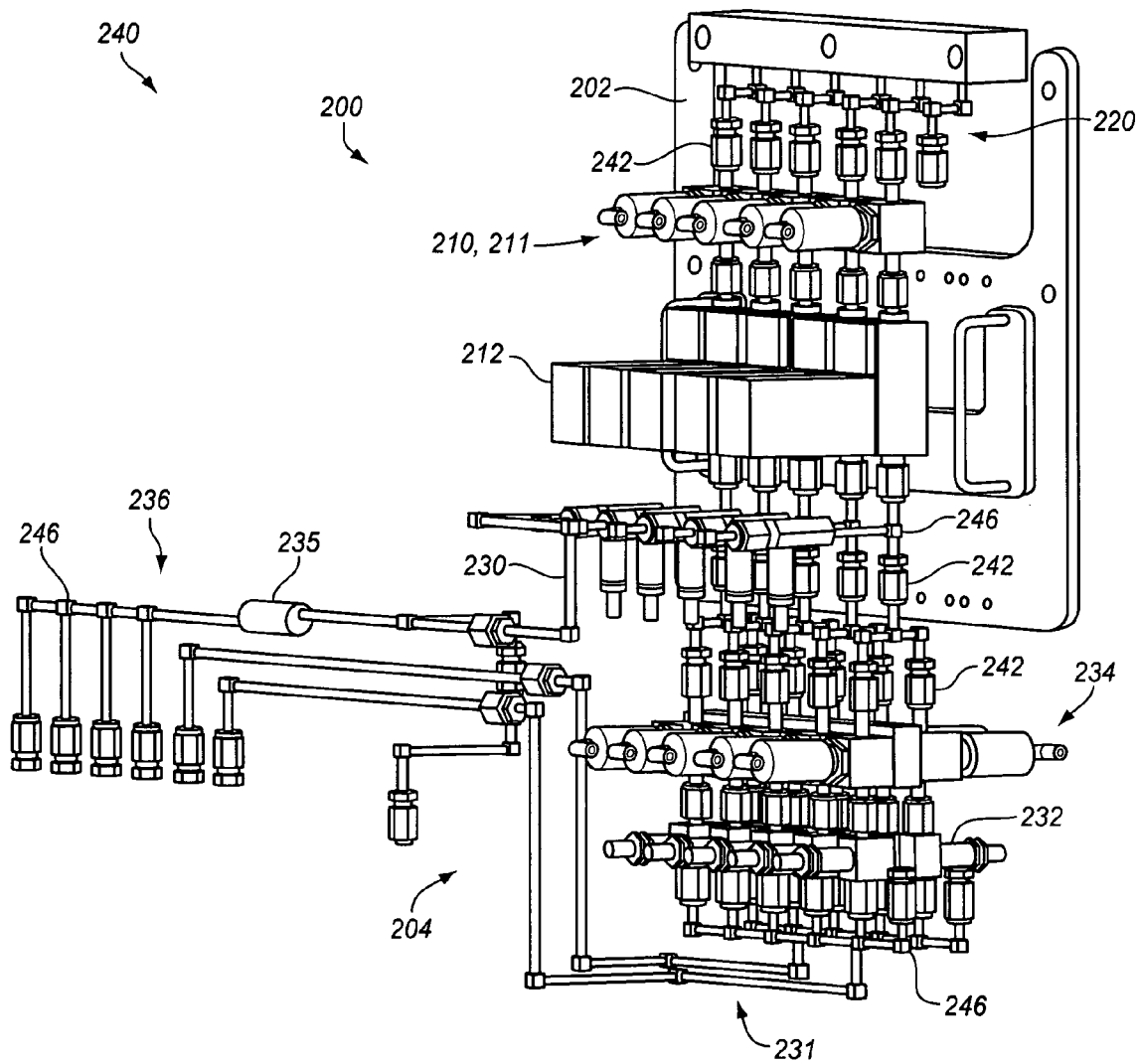
FIG. 4 contains a pictorial view of the gas manifold system of the prior art depicted in FIG. 3.

The invention is described herein with reference to FIGS. 5-20. It should be understood that the structures and systems depicted in schematic form in FIGS. 5-10, 13-20 are used to explain the invention and are not precise depictions of actual structures and systems in accordance with the invention. Furthermore, the embodiments described herein are not intended to limit the scope of the invention, which is defined in the claims below. For the sake of clarity, parts and elements of various embodiments having similar structure and function are identified using the same reference numerals in the figures below.

Figure 5:
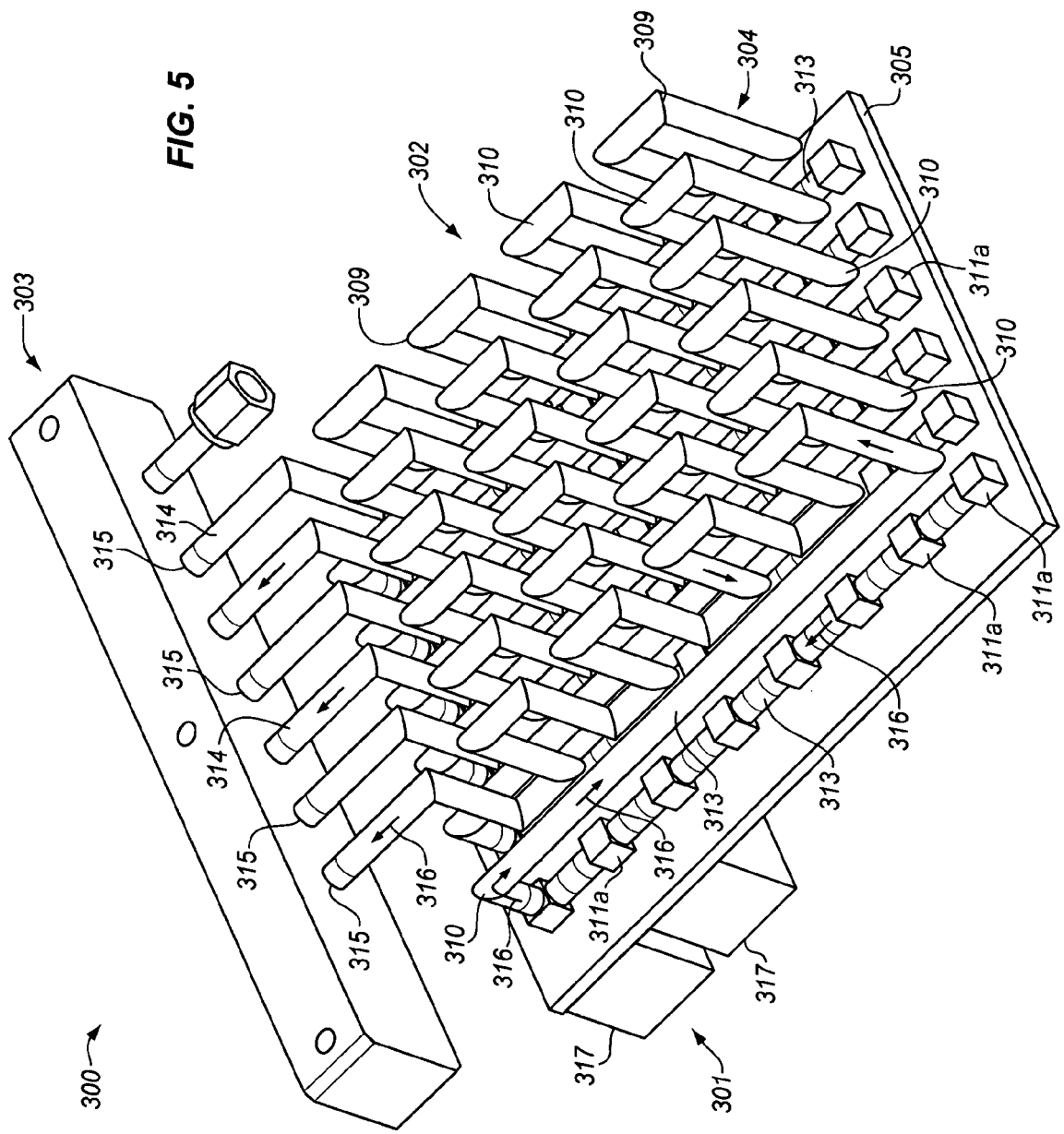
FIGS. 5 and 6 depict schematically perspective views of a partially assembled gas manifold in accordance with the invention.
Figure 6:
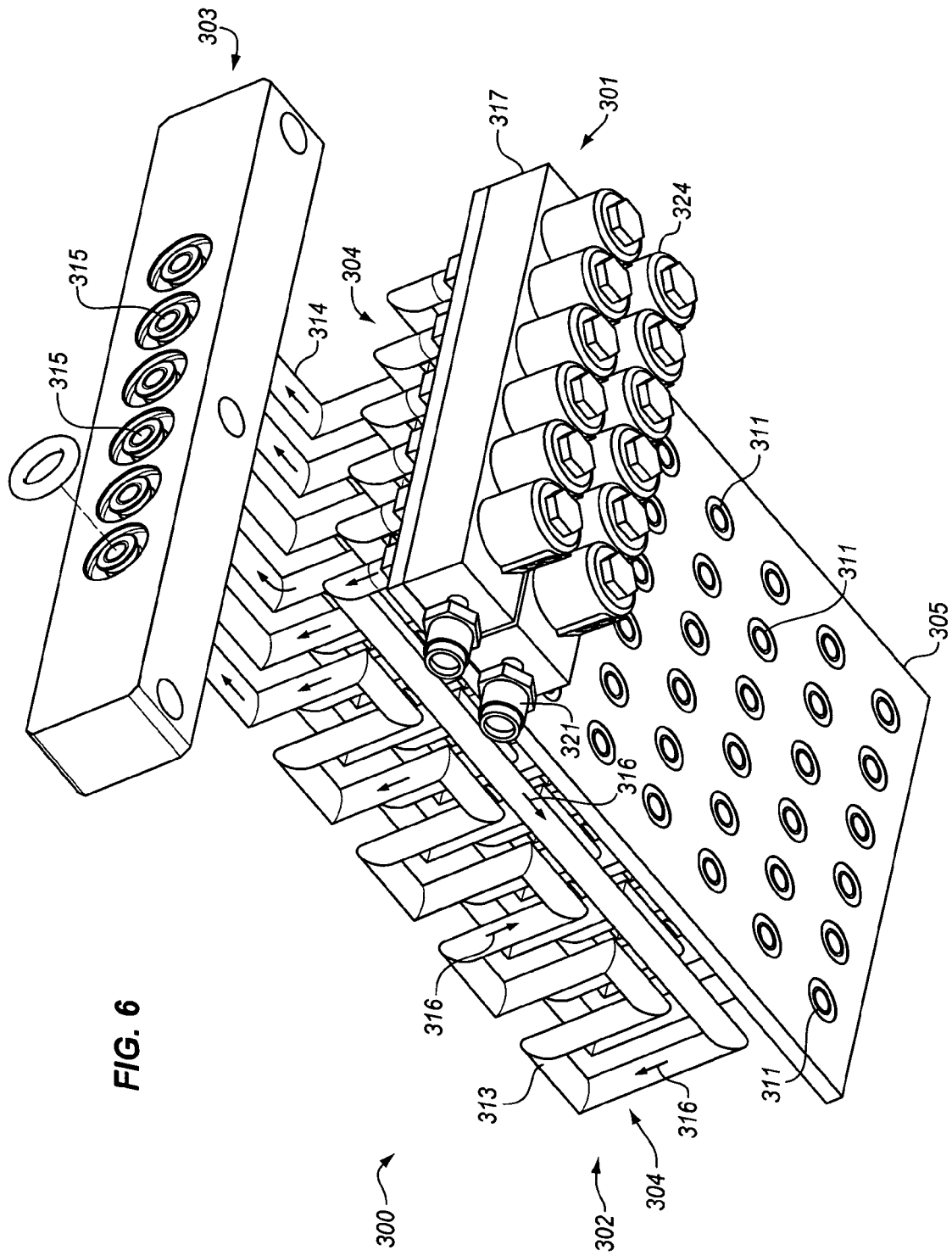

FIGS. 5 and 6 depict schematically perspective views of a partially assembled gas manifold 300 in accordance with the invention. Gas manifold 300 is an exemplary embodiment that is operable to provide up to six separate flow streams of gas mixtures in a semiconductor wafer processing system. In particular, gas manifold 300 is operable to provide up to six different outlet gas mixtures, each gas mixture containing up to eight different inlet gases. It is understood that each of the different inlet gases may itself be a mixture of gases. In accordance with the invention. Gas manifold 300 is operable to provide six outlet gas mixtures having different gas compositions and concentrations and different total gas flow rates. Although manifold 300 is described in terms of six different outlet gas mixtures and eight different inlet gases, it is understood that embodiments in accordance with the invention are adaptable to provide virtually any desired m-number (e.g., 30) of outlet gas mixture streams, each outlet mixture containing up to any n-number (e.g., 20) of different inlet gases.

Manifold 300 includes gas distribution section 301, gas mixing section 302, and mixture delivery section 303. Suitable construction materials for handling gas streams are known in the art of semiconductor processing, such as corrosion-resistant stainless steel. A widely-specified material for gas distribution applications, AISI 316L stainless steel, has an intrinsic corrosion resistance because of its ability to form a protective oxide or "passive" layer on its surface, which typically is achieved by alloying a chromium content greater than 12% with iron, nickel and molybdenum. The corrosion resistance at this steel's surface can be enhanced by increasing the amount of chromium that can form $Cr_2O_3$ in the presence of an oxidizing environment. Surface passivation by electropolishing is a technique for increasing corrosion resistance that is well known to those skilled in the art of metal treating. Another passivation process involves the use of organic citric acid in conjunction with specially formulated chelant systems to increase the surface concentration of chromium and chromium oxide at the surface. An exemplary citric acid passivation process is ULTRA PASS® Passivation, which is commercially available from Astro Pak Corporation, Costa Mesa, Calif. In gas mixing section 302, manifold 300 contains six gas mixture flow paths 304, each flow path 304 including a gas mixing conduit 310. Each of gas mixing conduits 310 is mounted on mounting plate 305 and comprises up to eight gas inlet holes 311 (FIG. 6), a gas mixing region 313, a gas outlet region 314 and a gas outlet hole 315. Gas mixing conduits 310 are designed so that during operation, each of gas inlet holes 311 is operable to conduct a source gas into a conduit 310 toward gas mixing region 313 in the direction of gas flow indicated by arrows 316, and the gas mixing region is operable to conduct a gas mixture toward gas outlet hole 315. Each gas inlet joint 311a depicted in FIG. 5 corresponds to a gas inlet hole depicted in FIG. 6 and a relatively short gas inlet region (not shown). In some embodiments, all of gas mixing conduits 310 are substantially identical. In some embodiments, however, at least two of gas mixing conduits 310 are substantially non-identical. This commonly occurs in embodiments in which manifold 302 is utilized to generate a plurality of non-identical gas mixtures. It is understood, however, that commonly an embodiment in accordance with the invention is operable to generate a plurality of gas mixture streams having non-identical gas mixture compositions even when gas mixing conduits 310 are substantially identical. Each of gas outlet holes 315 is connectable to a semiconductor wafer processing station (not shown) through gas mixture delivery section 303.

In some embodiments, as depicted in FIG. 5, gas mixing regions 313 include welded joints (elbows) 309 and no threaded joints. In some embodiments, gas mixing regions 313 include no welded joints and no threaded joints. In some embodiments, gas mixing regions 313 substantially comprise bent tubing, for example, bent stainless steel tubing. In some embodiments (not depicted), one or more gas mixing regions 313 include welded joints and/or threaded joints. A portion of mixing regions 313 of conduit 310 depicted in FIGS. 5 and 6 has a serpentine shape. A serpentine shape is useful to enhance gas mixing and to increase the overall length of a gas mixing conduit 310. Increasing the overall length of gas mixing conduit 310 is useful for, among other effects, increasing the overall residence time of gases to provide sufficient time for good mixing, and increasing the overall pressure drop of gases flowing into and through a conduit 310. It is understood that other geometric variables of a conduit also influence gas mixing and gas flow characteristics. For example, increasing the diameter of a portion of a gas mixing conduit generally decreases pressure drop through that portion and increases the residence time of gases in that portion for given mass flow rates of gases.

Figure 7:
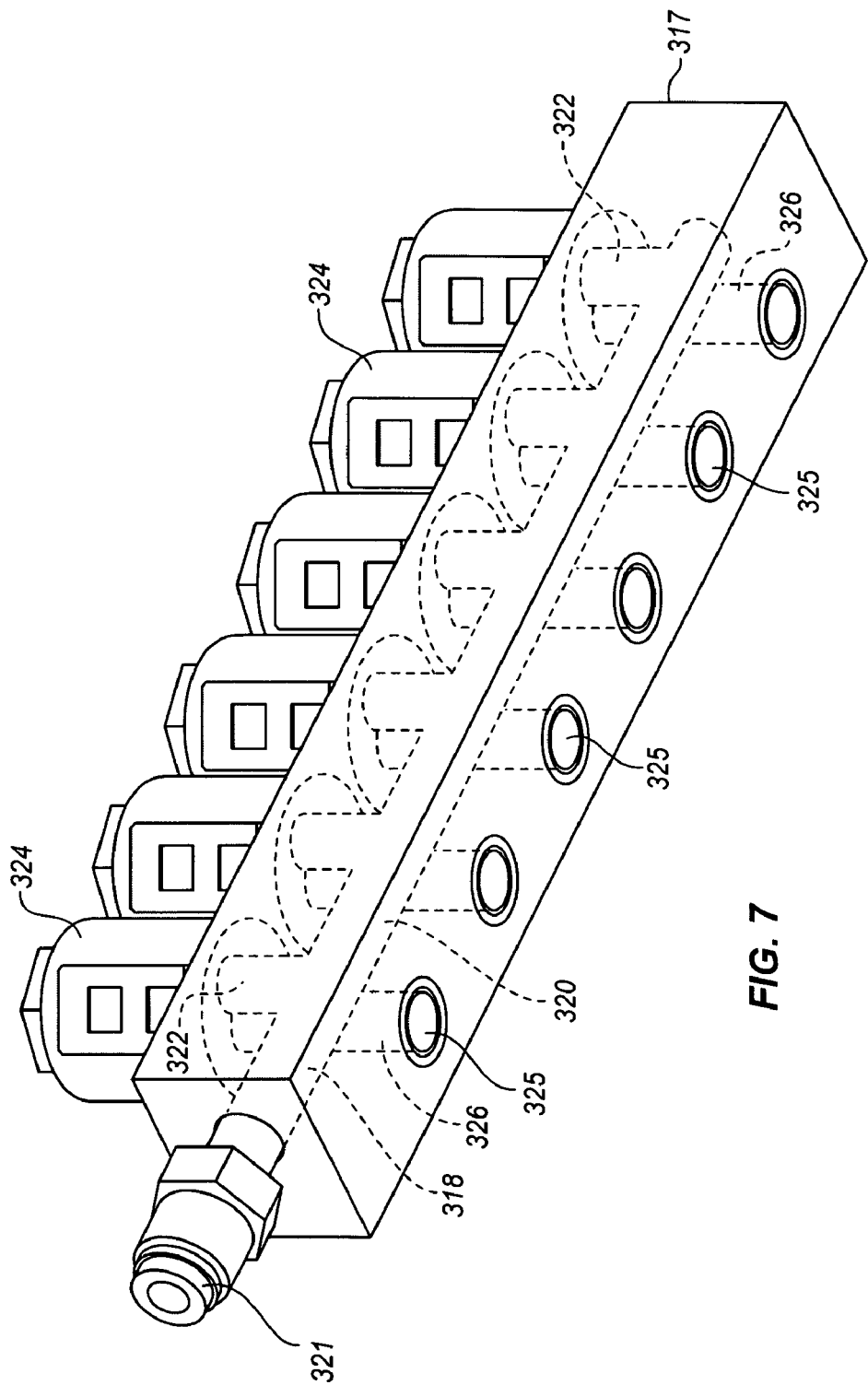
FIG. 7 depicts schematically perspective view of a gas distribution strip including a portion of a source gas flow path.

In gas distribution section 301, a fully assembled manifold 300 further comprises eight source gas flow paths. Gas distribution section 302 is operable to distribute a source gas from each of a plurality of separate source gas flow paths to each of a plurality of separate gas mixture flow paths without combining source gases from different source gas flow paths except in the gas mixture flow paths. FIGS. 5 and 6 depict two modular gas distribution strips 317 mounted on the reverse side of mounting plate 305 from which gas mixing conduits 310 are mounted. A fully assembled manifold 300 comprises a total of eight gas distribution strips 317 mounted on mounting plate 305. A gas distribution strip 317 is depicted in greater detail in FIG. 7. FIG. 7 depicts at least a portion of a source gas flow path 318 located in gas distribution strip 317. Manifold 300 comprises eight gas distribution ducts 320, each gas distribution duct 320 located in a gas distribution strip 317 (FIG. 7).

Each gas distribution duct 320 is operable to distribute a source gas to up to six of the six gas mixing conduits 310 through one of the eight gas inlet holes 311 leading into each gas mixing conduit. Each gas distribution duct 320 comprises a gas source port 321 that is connectable to a gas source (not shown). Each gas distribution duct 320 further comprises a plurality of up to six gas distribution ports 322. In manifold 300, flow of a source gas through each gas distribution port 322 is controlled by a gas inlet valve 324. Accordingly, manifold 300 comprises up to 48 gas inlet valves 324 (i.e., six conduits multiplied by eight gas inlet valves per conduit). Thus, in some other embodiments in accordance with the invention having m-number of outlet gas mixtures containing up to n-number of different mixed gases, the total number of gas inlet valves is m multiplied by n (m×n) (i.e., m conduits multiplied by n gas inlet holes (and valves) per conduit). Each of gas inlet holes 311 of each of gas mixing conduits 310 is connectable to a valve outlet port 325. Thus, in manifold 300, each gas inlet hole 311 is connectable to a gas source via a gas inlet valve 324, a gas distribution port 322 and a gas distribution duct 320. An exemplary suitable gas inlet valve 324 is selected from the AS Series two-way miniature diaphragm isolation valves commercially available from Gems Sensors & Controls, Plainville, Conn. In an exemplary embodiment, a source gas flows from gas distribution duct 320 through gas distribution port 322 to valve 324. A valve 324 is operable to direct gas to a valve outlet port 325 through a valve outlet 326.

In some embodiments, flow rates of a source gas to each separate source gas flow path 318, for example, to a gas distribution duct 320 is controlled by one or more mass flow controllers (not shown) using techniques known to one of ordinary skill in the art. In some embodiments, flow of a particular source gas from a gas distribution duct 320 into a particular gas mixing conduit 310 is then controlled by a gas inlet valve 324. Some embodiments include equipment and techniques known in the art of fluid flow control, such as orifice plates, to influence the flow of gas to and through a particular gas flow path. For example, some embodiments include one or more orifice plates (not shown) located in a gas mixing conduit 310 to influence the flow of one or more source gases into and through the gas mixing conduit. In some embodiments, one or a plurality or all of gas inlet valves 324 are replaced functionally by one or more removable plugs located to control flow of a source gas from a particular gas distribution port to a particular gas mixing conduit. An exemplary embodiment of an alternative mounting plate and corresponding plugs is described below with reference to FIG. 21.

The geometrical dimensions of gas mixing conduits 310 and gas distribution ducts 320 influence gas flow characteristics. The geometrical dimensions of gas mixing conduits and gas distribution ducts are designed using mathematical techniques known in the art.

In summary, gas mixing section 302 includes six separate gas mixture flow paths 304, each gas mixture flow path 304 being fluidically connectable to one or more of eight source gas flow paths 318. Gas distribution section 301 is operable to distribute a source gas from each of eight separate source gas flow paths 318 to each of up to six of separate gas mixture flow paths 304 in gas mixing section 302 without combining source gases from different source gas flow paths 318 except in gas mixture flow paths 304. Gas mixing section 302 is operable to mix a plurality of source gases in each of a plurality of separate gas mixture flow paths 304 to generate a plurality of separate gas mixtures. Gas mixing section 302 of gas manifold 300 is operable to provide a gas mixture in a gas mixture stream in one, a plurality or all of gas mixture flow paths 304 to a substrate processing station without combining the gas mixture stream with another gas stream. Gas mixing section 302 of gas manifold 300 is operable to provide a gas mixture in a gas mixture stream in one, a plurality or all of gas mixture flow paths 304 to a substrate processing station without splitting the gas mixture stream. Accordingly, in preferred embodiments of gas manifold 300, each separate source gas flow path 318 receives input from only one gas source, and each gas mixture flow path 304 receives input only from one or more source gas flow paths directly. Thus, in preferred embodiments, each gas mixture flow path 304 receives one or more source gases directly from gas sources only (through one or more corresponding source gas flow paths, but not from some other gas flow path in which source gases have already been mixed). Gas manifold 300 is operable to provide a gas mixture in a gas mixture stream through one, a plurality or all of gas mixture flow paths 304 to a substrate processing station without combining the gas mixture stream with another gas stream. Gas mixing section 302 of gas manifold 300 is operable to provide a gas mixture in a gas mixture stream through one, a plurality or all of six gas mixture flow paths 304 to a substrate processing station without splitting the gas mixture stream. In gas manifold 300, each of eight separate source gas flow paths 318 in gas distribution section 301 includes a gas distribution duct 320. Each of eight gas distribution ducts 320 comprises a gas source port 321 that is connectable to a corresponding gas source (not shown), and each gas distribution duct comprises six gas distribution ports 322. Each of six separate gas mixture flow paths 304 includes a gas mixing conduit 310. Each gas mixing conduit 310 comprises eight gas inlet holes 311, a gas mixing region 313, and a gas outlet hole 315. Gas inlet holes 311 lead source gases into gas mixing conduit 310 toward gas mixing region 313. A gas mixing region 313 leads gas toward a gas outlet hole 315, which leads a gas mixture out of gas mixing conduit 310. Each of 48 gas inlet holes 311 is connectable to one of 48 gas distribution ports 322, and each of six gas outlet holes 315 is connectable to a substrate processing station in a substrate processing system. Each of six gas mixing conduits 304 is operable: to receive up to eight source gases by receiving a single source gas from each of up to eight gas distribution ducts 320 through each of up to eight corresponding gas inlet holes 311; to mix the source gases to generate a gas mixture; and to provide the gas mixture through gas outlet hole 315 to a substrate processing station. Gas manifold 300 is operable: to generate a gas mixture in each of a plurality of gas mixture flow paths 304 using only source gases from a plurality of gas distribution ducts 320 delivered through gas inlet holes 311; and to provide the gas mixture in a gas mixture stream to a substrate processing station without splitting the gas mixture stream. Gas manifold 300 is operable: to provide a gas mixture in a gas mixture stream to a substrate processing station without combining the gas mixture stream with another gas stream. Gas manifold 300 is operable: to provide a gas mixture in a gas mixture stream to a substrate processing station without combining the gas mixture stream with another gas stream. In some embodiments of gas manifold 300, each of gas mixing conduits 310 is operable to provide a gas mixture in a gas mixture stream to a semiconductor wafer processing station. In some embodiments, each of a plurality of gas mixture flow paths 304 is connectable to only one substrate processing station in a substrate processing system.

Example 1

FIG. 8A depicts schematically a cross-sectional view 330 of one of six identical gas mixing conduits 310 described above with reference to FIGS. 5 and 6. The dimensions indicated in FIG. 8A are in units of centimeters (cm). Gas mixing conduit 310 is formed using nominal 0.375 inch (0.953 cm) stainless steel tubing having an inside diameter of 0.759 cm (0.299 inch). Gas mixing conduit 310 comprises eight gas inlet holes 311 and corresponding gas inlet joints 311a and gas inlet regions 312, a gas mixing region 313, a gas outlet region 314 and a gas outlet hole 315. Exemplary ranges of flow rates of source gases flowing simultaneously into a gas mixing conduit having the dimensions of gas mixing conduit 310 described with reference to FIG. 8A include:

| $O_2$: | 1,000-20,000 standard cubic centimeters per minute (sccm) |
| $N_2$: | 0-5,000 sccm |
| $H_2/N_2$: | 0-5,000 sccm |
| $CH_4$: | 0-200 sccm |

FIG. 8B depicts schematically a plan view 340 of gas inlet holes 311 and gas inlet section 312 of gas mixing conduit 310. Inlet section 312 includes welded joints 332.

Thus, it has been determined that a gas mixing conduit in accordance with the invention having dimensions resulting in a relatively long residence time of gases in the gas mixing conduit effectively mixes gas mixtures in which the difference in concentration between two or more components (e.g., difference in relative flow rates) is three orders of magnitude or more.

In manifold 300, six gas mixing conduits 310 have substantially identical dimensions and eight gas distribution ducts 320 have substantially identical dimensions. In manifold 300, gas distribution ducts 320 and gas mixing conduits 310 have substantially identical diameters. In some embodiments, one or several of shape, length and diameter dimensions among different gas mixing conduits 310 are not identical. Similarly, in some embodiments, one or several of shape, length and diameter dimensions among different gas distribution ducts 320 are not identical.

A typical characteristic of gas manifold systems of the prior art, for example, as described in the background section of this specification with reference to FIGS. 1-4, is that two or more source gases are initially mixed together to make an initial mixture, the initial mixture is then combined with one or more source gases or other gas mixtures, and then one or more final mixtures are divided (split up) and distributed to various substrate processing stations.

In contrast, preferred embodiments in accordance with the present invention combine and mix all source gases for a given final mixture substantially at one time and one place, and then provide the final mixture to a substrate processing station without additional combining, mixing or splitting. To make a plurality of final mixtures, preferred embodiments in accordance with the present invention distribute all source gases substantially simultaneously to a corresponding plurality of gas mixture flow paths. In other words, there is essentially only one distribution of gases to each gas mixture flow path and only one mixing of gases to make each final gas mixture, without additional mixing, combining or splitting of the final gas mixtures.

Another typical characteristic of gas manifold systems of the prior art is that each system is essentially custom-designed for a particular application requiring a plurality of gas mixtures having different compositions. As a result, gas manifold systems of the prior art have complex tubing and valve designs, they have limited flexibility, and they tend to require large spaces to accommodate even limited flexibility.

In contrast, embodiments in accordance with the present invention provide efficient and flexible methods and systems that provide a plurality of gas mixtures having different compositions and which occupy a relatively small compact space.

The word "corresponding" is used in this specification to express that one element of a manifold is "matched" with only one other element of the manifold. For example, language such as "each of a plurality of gas inlet holes is connectable to a corresponding one of gas distribution ports" means that each one of a plurality of gas inlet holes is connectable to only one particular "corresponding" gas distribution port and not to any other gas distribution port. Similarly, language such as "receiving a single source gas from each of a plurality of gas distribution ducts through each of a plurality of corresponding gas inlet holes" indicates that only one of a plurality source gases is received through a particular "corresponding" one of a plurality of gas inlet holes and not through any other gas inlet hole. Similarly, language such as "flowing a plurality of separate gas mixture streams through a corresponding plurality of gas mixture flow paths" means that only one of a plurality of gas mixture streams flows through a particular one of a plurality of gas mixture flow paths without flowing through any other gas mixture flow path.

FIG. 9 depicts schematically a mounting plate 342 in accordance with the invention. A mounting plate 342 functions in a manner similar to mounting plate 305 described above with reference to FIG. 5. Mounting plate 342 comprises eight plate sections 344a-344h, each of which is designed for mounting of a corresponding gas distribution strip in accordance with the invention. Each plate section of mounting plate 342 comprises zero, one or a plurality of up to eight gas inlet apertures 346. FIG. 9 also depicts a gas distribution strip 354. A gas inlet aperture 346 serves to provide a passage through mounting plate 342 for a source gas from one of eight gas distribution strips 354 into a gas inlet hole (e.g., a gas inlet hole 311 depicted in FIG. 8A) of a gas mixing conduit in accordance with the invention. Thus, each plate section 344 is designed to provide a passage of a particular source gas to a given number of up to eight gas mixtures. In contrast to gas mounting plate 305 and gas distribution strips 317 in manifold 300 described above, however, mounting plate 342 is less flexible because not all of plate sections 344a-344h are designed to provide passage of a source gas to any desired number of gas mixtures. Although apertures 346 shown in FIG. 9 are depicted as having identical dimensions, it is understood that in some embodiments, one or more of a plurality of individual gas inlet apertures 346 have different geometries and/or dimensions, which are selected to influence the gas flow rate of the particular source gas into a particular gas mixture flow path. For example, a particular gas inlet aperture 346 may be relatively large and present substantially no resistance to gas flow, whereas another gas inlet aperture 346 may be a laser-drilled orifice presenting substantial resistance to gas flow. In preferred embodiments, plate sections 344a-344h are modular; that is, any of the plate sections may be switched out and replaced with another section, for example, with a section having more or less gas inlet apertures, or gas inlet apertures having different dimensions.

Figure 10A:
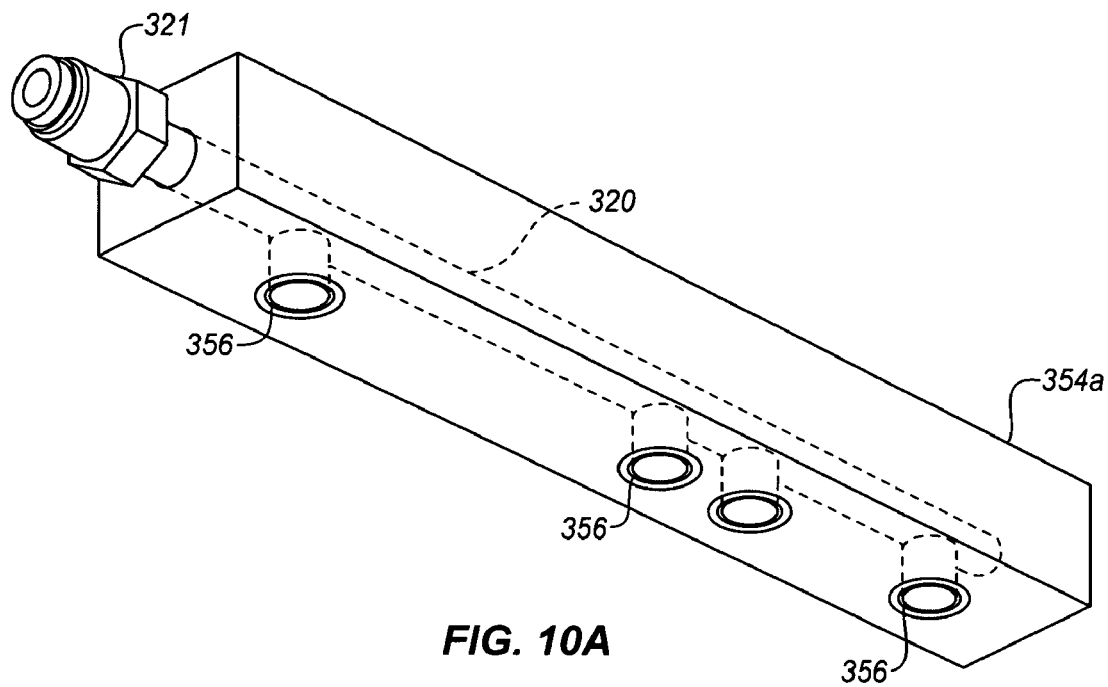
FIGS. 10A and 10B depict schematically gas distribution strips in accordance with the invention.
Figure 10B:
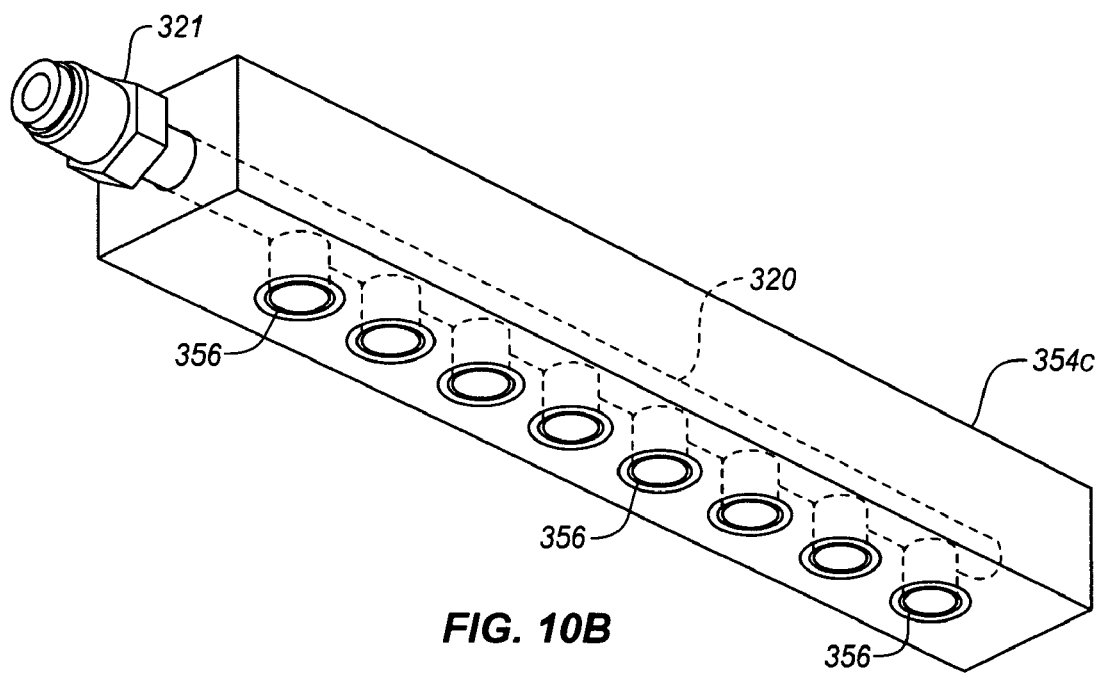

FIGS. 10A and 10B depict schematically gas distribution strips 354a and 354c, respectively. Gas distribution strip 354a comprises a gas distribution duct 320 and a total of four gas distribution ports 356. Thus, gas distribution strip 354a assembled on a mounting plate 342 is operable to provide a source gas to up to four gas mixture conduits in accordance with the invention. For example, gas distribution strip 354a assembled in mounting plate section 344a provides a source gas to four gas mixture flow paths through four gas inlet apertures 346. It is understood, however, that a gas distribution strip having a given number of gas distribution ports 356 need not be assembled only in a mounting plate section having an identical number of matching gas inlet apertures 346. For example, gas distribution strip 354a mounted on mounting plate 342 in mounting plate section 344c is operable to provide a source gas to four gas mixture conduits through four gas inlet apertures 346. The remaining gas inlet apertures 346 in mounting plate section 344c would be simply blocked off by a gas distribution strip 354a. Gas distribution strip 354c comprises eight gas distribution ports 356. Gas distribution strip 354c mounted in mounting plate section 344c is operable to provide a particular source gas to eight gas mixture flow paths through eight gas inlet apertures 346. A gas distribution strip 354c having a relatively large number of gas distribution ports 356 is also operable to provide a particular source gas to a fewer number of gas mixture flow paths. For example, gas distribution strip 354c having eight gas distribution ports 356 assembled in mounting plate section 344f would operate to provide a particular source gas to only two gas mixture flow paths through the two gas inlet apertures 346 of mounting plate section 344f. The remaining six gas distribution ports 356 of gas distribution strip 354c would be blocked by mounting plate 342. Thus, in some embodiments, control of source gases to various gas mixture flow paths in a manifold in accordance with the invention is achieved by selecting the number of gas inlet apertures 346, the geometry and size of gas apertures 346, the number of gas distribution ports 356, and various combinations thereof. In preferred embodiments, gas distribution strips are modular; that is, any of the gas distribution strips may be switched out and replaced with another gas distribution strips, for example, with a gas distribution strip having more or less gas distribution ports, or having one or more gas distribution ports with different geometric dimensions.

Thus, embodiments in accordance with the invention comprising a mounting plate with a plurality of interchangeable plate sections and a plurality of interchangeable gas distribution strips similar to mounting plate 342 and gas distribution strips 354a, 354c have the flexibility of being modular. For example, any of the plate sections and/or the gas distribution strips may be switched out and replaced with strip. Embodiments in which a mounting plate does not have completely interchangeable sections can also be modified by replacing the whole mounting plate with another mounting plate having a different configuration (number, dimensions) of gas inlet apertures.

A manifold in accordance with the invention comprising a mounting plate and a plurality of gas distribution strips similar to mounting plate 342 and gas distribution strips 354a, 354c has somewhat less flexibility than a manifold such as manifold 300 described above. Nevertheless, a manifold having a mounting plate 342 and gas distribution strips 354 that does not utilize gas inlet valves (such as gas inlet valves 324 in manifold 300) is generally much less expensive to build and to operate than a manifold using a large number of gas inlet valves. It is understood that some embodiments in accordance with the invention utilize gas inlet valves, such as gas inlet valves 324, to control the distribution and flow of one or more source gases to one or more gas mixture flow paths, together with mounting plate sections and gas distribution strips without gas inlet valves (such as mounting plate sections 344 and gas distribution strips 354) to control one or more source gases to one or more gas mixture flow paths.

In some preferred embodiments, as depicted in FIGS. 5, 6 and 8A, the gas mixing region 313 in each of a plurality of the gas mixing conduits includes only one flow channel, wherein the flow channel has no intersections with other gas flow channels. In some embodiments, as depicted in FIGS. 7, 10A and 10B, each of a plurality of the gas distribution ducts 320 comprises only one flow channel, wherein the flow channel has no intersections with other gas flow channels. In some embodiments, as depicted in FIGS. 5, 6 and 8A, each of a plurality of the gas mixing conduits 310 comprises only one flow channel, wherein the flow channel has no intersections with other gas flow channels. In some preferred embodiments, the gas outlet hole of each of a plurality of the gas mixing conduits is connectable to only one substrate processing station in a substrate processing system.

The terms "flow channel" and "gas channel" are used in a general sense in this specification to refer to any course or passage through which gas flows in a continuous path. Language such as "wherein the flow channel has no intersections with other gas flow channels" and similar language mean that a particular flow channel does not intersect with one or more other flow channels except, of course, for intersections at the beginning and end of the particular flow channel. For example, the flow channel of each gas mixing conduit 310 in FIGS. 5, 6 and 8A does not intersect with other flow channels except at gas inlet holes 311 (beginning) and gas outlet hole 315 (end). Similarly, each gas distribution duct 318 in FIGS. 7, 10A and 10B does not intersect with other flow channels except at gas source port 321 (beginning) and gas distribution ports 322, 356 (end).

Figure 11:
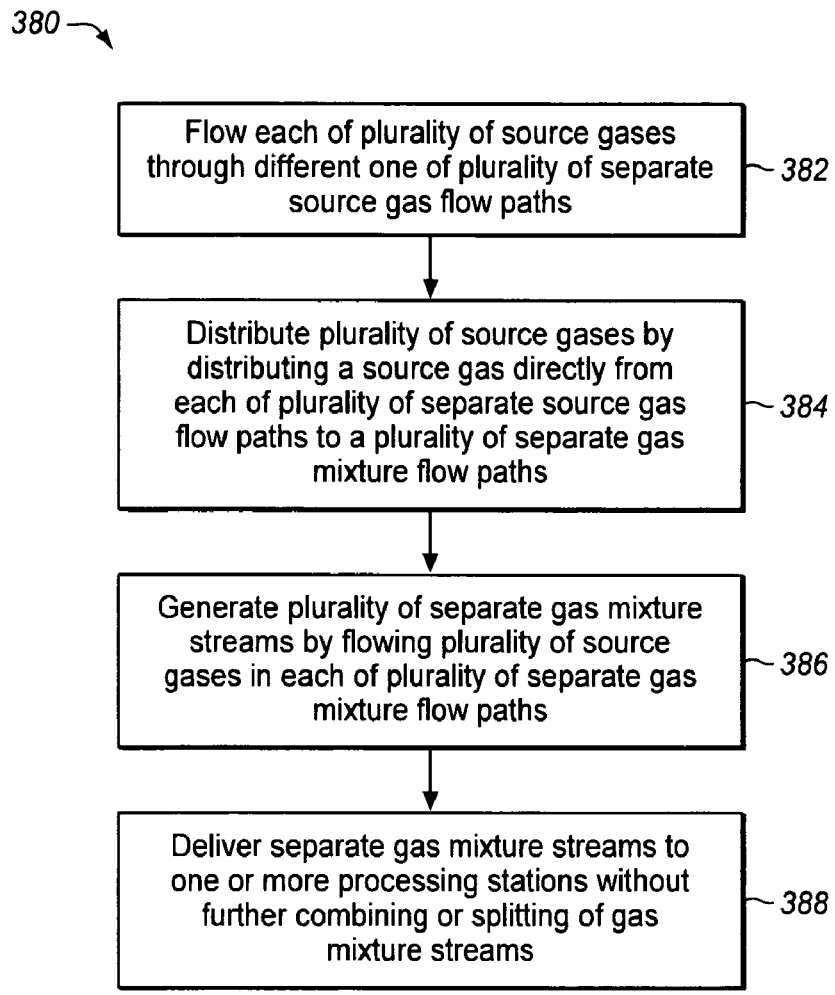
FIG. 11 contains a process flow sheet of a generalized method in accordance with the invention for providing a plurality of separate gas mixture streams.

FIG. 11 contains a process flow sheet 380 of a generalized method in accordance with the invention for providing a plurality of separate gas mixture streams. Step 382 comprises flowing a plurality of source gases to a plurality of separate gas mixture flow paths by flowing each of plurality of source gases through a different one of a plurality of separate source gas flow paths. For example, with reference to manifold 300 depicted in FIGS. 5 and 6, particularly to gas distribution strip 317 depicted in FIG. 7, step 382 comprises flowing one of eight different source gases through one of eight separate source gas flow paths 318 (FIG. 7) towards one of six separate gas mixture flow paths 304 (FIGS. 5 and 6). Step 384 comprises distributing a plurality of source gases to a plurality of separate gas mixture flow paths by distributing a source gas directly from each of a plurality of the separate source gas flow paths to a plurality of the separate gas mixture flow paths. For example, with reference to manifold 300, step 642 comprises distributing a source gas directly from each of a plurality of the separate source gas flow paths 318 to a plurality of the separate gas mixture flow paths 304. The term "distributing a source gas directly" in this regard emphasizes a feature of embodiments in accordance with the invention of distributing a source gas without additional splitting of the source gas stream at a location between the source gas flow path and the gas mixture flow path. The term "distributing a source gas directly" here also emphasizes a feature of embodiments in accordance with the invention of distributing a source gas to one or more gas mixture flow paths without combining another gas stream with the source gas stream at a location between the source gas flow path and the gas mixture flow path. Step 386 comprises generating a plurality of separate gas mixture streams by flowing a plurality of source gases in each of a plurality of separate gas mixture flow paths. For example, with reference to manifold 300, step 386 comprises flowing a plurality of source gases in each of a plurality of separate gas mixture flow paths 304. In preferred embodiments, a step 388 comprises delivering separate gas mixture streams to one or more processing stations without further combining or splitting of gas mixture streams. In preferred embodiments, flowing a plurality of source gases to a plurality of separate gas mixture flow paths does not include combining source gases from different source gas flow paths except in the gas mixture flow paths. In preferred embodiments, distributing a plurality of source gases to a plurality of separate gas mixture flow paths by distributing a source gas directly from a plurality of separate source gas flow paths to a plurality of separate gas mixture flow paths does not include combining source gases from different source gas flow paths except in gas mixture flow paths. In preferred embodiments, flowing a plurality of separate gas mixture streams through a corresponding plurality of gas mixture flow paths to at least one substrate processing station is performed without combining any of the separate gas mixture streams with another gas stream. In preferred embodiments, flowing a plurality of separate gas mixture streams through a corresponding plurality of gas mixture flow paths to at least one substrate processing station is performed without splitting any of the separate gas mixture streams. In preferred embodiments, each of a plurality of gas mixture flow paths comprises only one flow channel, wherein the flow channel has no intersections with another gas flow channel. In preferred embodiments, each of a plurality of separate source gas flow paths comprises only one flow channel, wherein the flow channel has no intersections with another gas flow channel.

Figure 12:
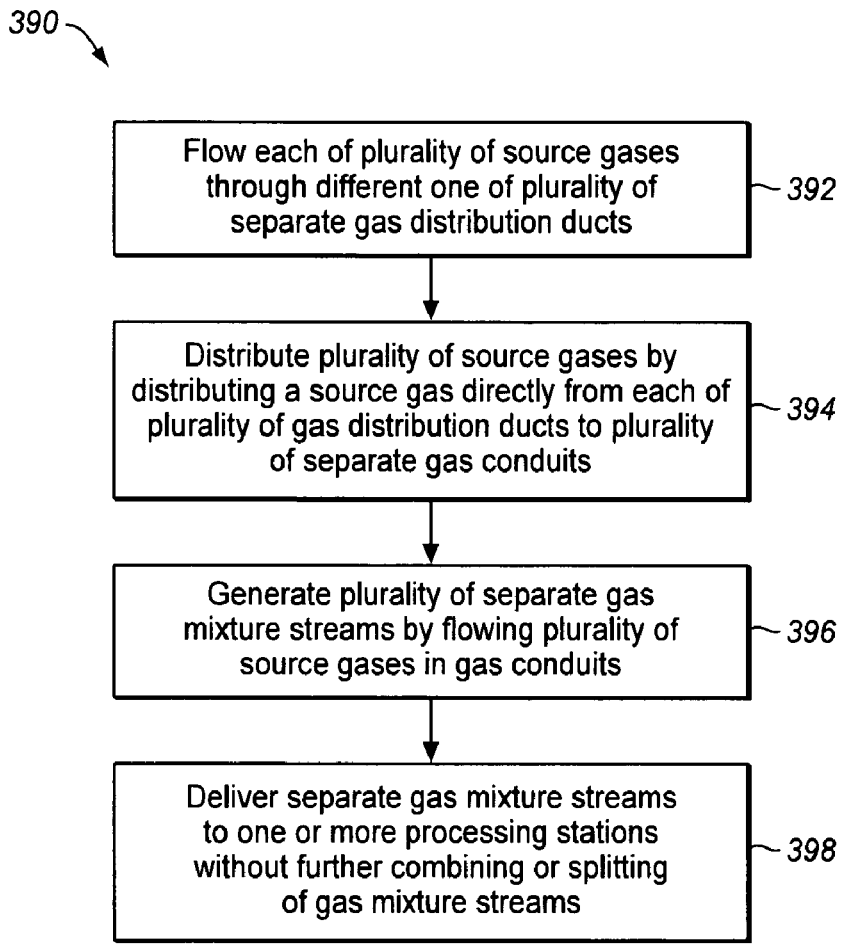
FIG. 12 contains a process flow sheet 660 of a preferred embodiment of generalized method in accordance with the invention for providing a plurality of separate gas mixture streams.

FIG. 12 contains a process flow sheet 390 of a preferred embodiment of generalized method in accordance with the invention for providing a plurality of separate gas mixture streams. In step 392, flowing each of a plurality of source gases through a different one of a plurality of separate source gas flow paths includes flowing each of a plurality of source gases through a different one of a plurality of gas distribution ducts. For example, with reference to manifold 300 depicted in FIGS. 5 and 6, particularly to gas distribution strip 317 depicted in FIG. 7, each gas distribution duct 320 comprises at least one gas source port 321 that is connectable to a gas source. In step 394, distributing a plurality of source gases to the plurality of separate gas mixture flow paths 304 includes distributing a source gas directly from a plurality of gas distribution ducts 320 to a plurality of gas mixing conduits 304, each gas mixing conduit 304 comprising a plurality of gas inlet holes 311, a gas mixing region 313, and a gas outlet hole 315. In step 396, generating a plurality of separate gas mixture streams by flowing a plurality of source gases in each of a plurality of separate gas mixture flow paths comprises flowing a plurality of source gases in each of a plurality of gas mixing conduits 310. In preferred embodiments, a step 398 comprises delivering separate gas mixture streams from gas outlet holes 315 to one or more processing stations (not shown) without further combining or splitting of gas mixture streams.

Figure 13:
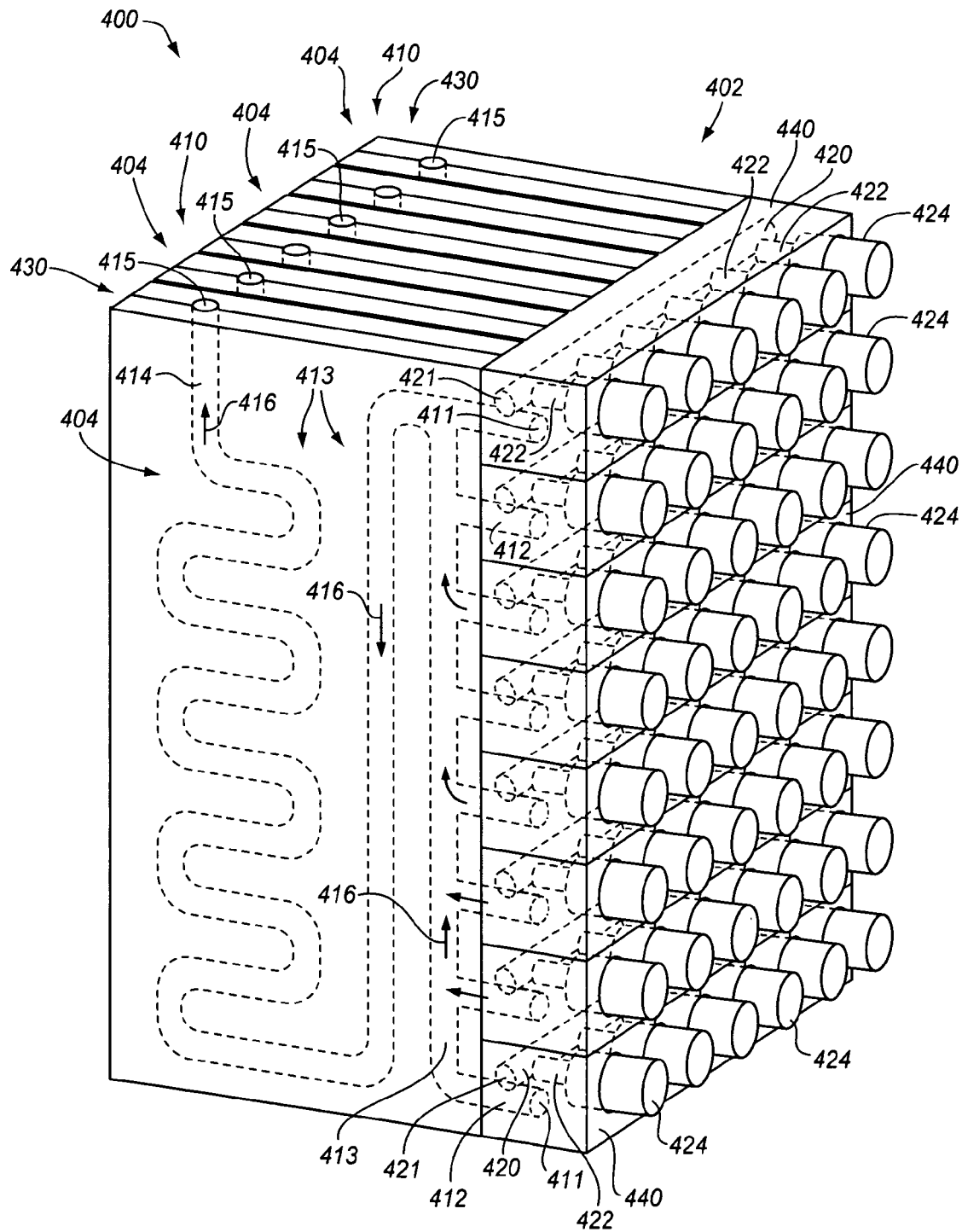
FIG. 13 depicts schematically an exemplary gas manifold in accordance with the invention that is operable to provide up to six separate flow streams of gas mixtures to a semiconductor wafer processing system.

FIG. 13 depicts schematically a gas manifold 400, which is an exemplary embodiment in accordance with the invention that is operable to provide up to six separate flow streams of gas mixtures to a semiconductor wafer processing system. In particular, gas manifold 400 is operable to provide up to six different outlet gas mixtures, each gas mixture containing up to eight different inlet gases.

It is understood that each of the different inlet gases may itself be a mixture of gases. In accordance with the invention, gas manifold 400 is also operable to provide six outlet gas mixtures having different total gas flow rates. Although manifold 400 is described in terms of six different outlet gas mixtures and eight different inlet gases, it is understood that embodiments in accordance with the invention are adaptable to provide virtually any desired m-number (e.g., 30) of outlet gas mixture streams, each outlet mixture containing up to any n-number (e.g., 20) of different inlet gases.

Manifold 400 includes a grooved block 402 of substantially solid material. Suitable materials include construction materials known in the art of semiconductor processing, such as stainless steel. Grooved block 402 contains six sets of interconnected grooves 404, each set of grooves 404 designed to form a gas mixing conduit 410. Each of gas mixing conduits 410 comprises up to eight gas inlet holes 411, eight corresponding gas inlet regions 412, a gas mixing region 413, a gas outlet region 414 and a gas outlet hole 415. Gas mixing conduits 410 are designed so that during operation, each of gas holes 411 is operable to conduct a source gas into a conduit 410 toward gas mixing region 413 in the direction of gas flow indicated by arrows 416, and the gas mixing region is operable to conduct a gas mixture toward gas outlet hole 415. In some embodiments, all of gas mixing conduits 410 are substantially identical. In some embodiments, however, at least two of gas mixing conduits 410 are substantially non-identical. This commonly occurs in embodiments in which manifold 402 is utilized to generate a plurality of non-identical gas mixtures. It is understood, however, that commonly an embodiment in accordance with the invention is operable to generate a plurality of gas mixture streams having non-identical gas mixture compositions even when gas mixing conduits 410 are substantially identical. In accordance with the invention, each of gas outlet holes 415 is connectable to a semiconductor wafer processing station (not shown).

As depicted in FIG. 13, gas mixing regions 413 formed by grooves 404 include no welded joints and no threaded joints. A portion of mixing region 413 of conduit 410 depicted in FIG. 13 has a serpentine shape.

In some embodiments, grooves 404 are formed by machining material using techniques known in the field of metal and material forming. In some embodiments, grooves 404 are manufactured using casting and molding techniques known in the field of metal and material forming. In some embodiments, grooves 404 are manufactured using stamping techniques known in the field of metal and material forming.

Manifold 400 further comprises eight gas distribution ducts 420, each of which is operable to distribute a source gas to up to six of the six gas mixing conduits 410 through one of the eight gas inlet holes 411 leading into each gas mixing conduit. Each gas distribution duct 420 comprises a gas source port 421 that is connectable to a gas source (not shown). Each gas distribution duct 420 further comprises a plurality of up to six gas distribution ports 422. Each gas distribution port is connectable to a valve input (not shown) of a gas inlet valve 424. Accordingly, manifold 400 comprises up to 48 gas inlet valves 424 (i.e., six conduits multiplied by eight gas inlet valves per conduit). Thus, in some other embodiments in accordance with the invention having m-number of outlet gas mixtures containing up to n-number of different mixed gases, the total number of gas inlet valves is m multiplied by n (m×n) (i.e., m conduits multiplied by n gas inlet holes (and valves) per conduit). Each gas inlet holes 411 of each of gas mixing conduits 410 is connectable to a valve output (not shown) of a gas inlet valve 424. Thus, in manifold 402, each gas inlet hole 411 is connectable to a gas source via a gas inlet valve 424, a gas distribution port 422 and a gas distribution duct 420. In manifold 400, gas distribution ducts 420 are formed by eight sets of grooves located in grooved block 402.

The geometrical dimensions of grooved gas mixing conduits 410 and grooved gas distribution ducts 420 influence gas flow characteristics. The geometrical dimensions of gas mixing conduits and gas distribution ducts are designed using mathematical techniques known in the art. A benefit of grooved gas mixing conduits and grooved gas distribution ducts, however, is that they can be manufactured and assembled more easily and less expensively than gas delivery tubing. Furthermore, the design and manufacture of grooved gas mixing conduits and grooved gas distribution ducts in accordance with the invention enable more flexibility of geometrical dimensions and greater predictability of gas flow characteristics (because grooved gas mixing conduits and grooved gas distribution ducts include fewer welded joints and threaded joints) compared with gas delivery systems that consist substantially of metal or other types of standard tubing.

Grooved block 402 comprises six pairs of grooved plates 430 arranged in modular fashion. Each pair of plates 430 is designed so that when the two plates are joined together, their grooves 404 together form one of gas mixing conduits 410. Because manifold 400 typically is operable to provide six outlet gas mixture streams that are not all identical (i.e., at least one of the six outlet mixtures is different from at least one of the other five outlet mixtures), in some embodiments, the six gas mixing conduits 410 are not identical. Gas mixing conduits 430 are designed to influence the gas flow rates and gas composition of the outlet mixtures. Geometrical dimensions of a conduit 430 used to influence gas flow rate, gas composition, and gas mixing performance include, for example, gas mixing conduit length, gas mixing conduit diameter, gas mixing conduit shape. Means for varying gas mixing conduit diameters include varying groove diameter and using orifice plates. The use of grooved material to form one or more gas mixing conduits in a gas manifold system is novel and it offers a wide range of benefits.

Grooved block 402 further comprises eight grooved strips 440, each of which contains grooves that form a gas distribution duct 420. In some embodiments, the grooves in strips 440 are formed by machining material using techniques known in the field of metal and material forming. In some embodiments, each strip 440 comprises a pair of plates joined together (not shown). In some embodiments, grooved strips 440 are manufactured using casting and molding techniques known in the field of metal and material forming. In some embodiments, grooved strips 440 are manufactured using stamping techniques known in the field of metal and material forming.

An exemplary construction material of all or part of grooved block 402 is AISI 316L stainless steel, as described above. In preferred embodiments, stainless steel gas flow channels are surface passivated; for example, by electropolishing and/or citric acid passivation, as described above.

Figure 14:
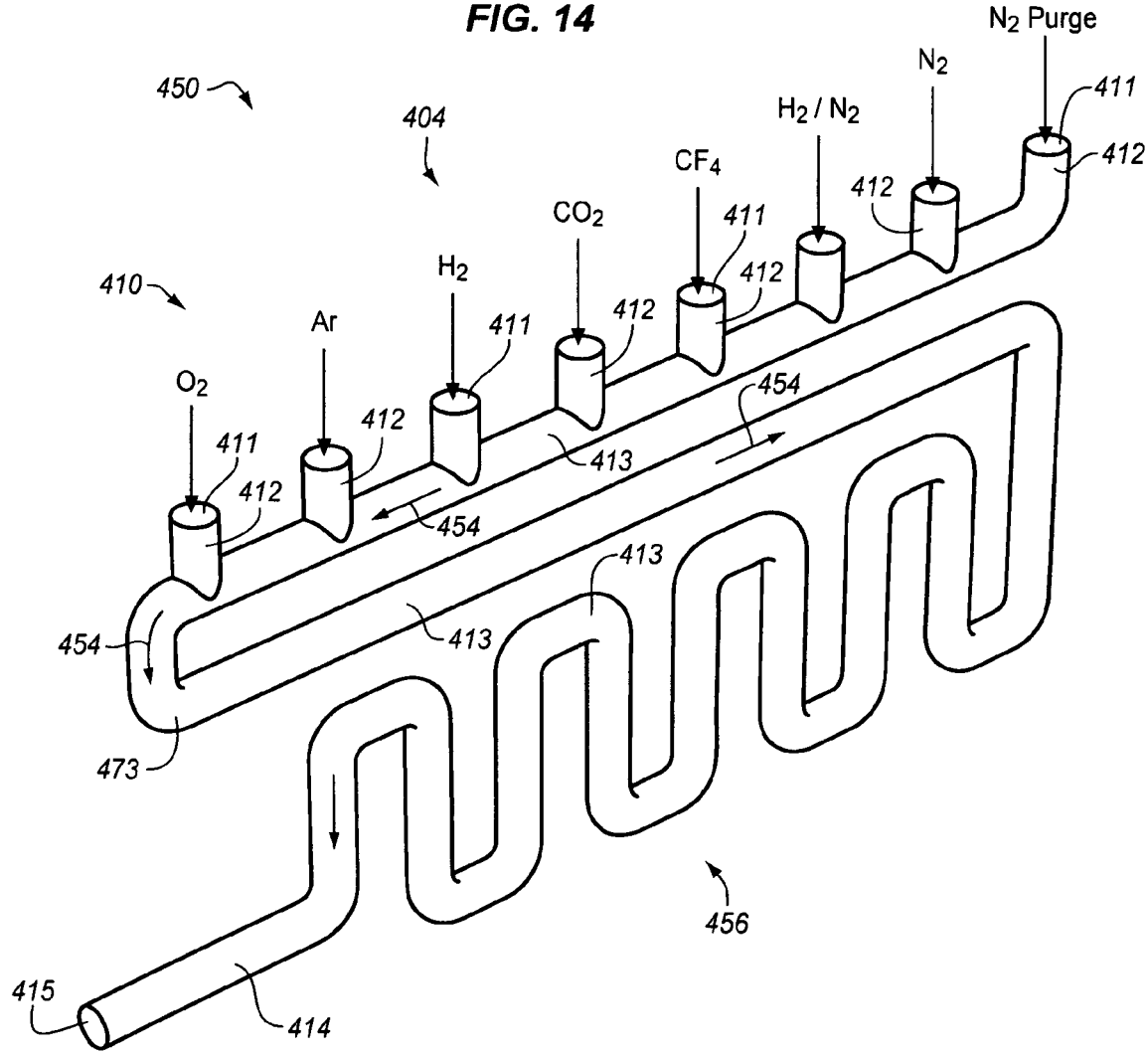
FIG. 14 depicts schematically a perspective view of one of the gas mixing conduits in accordance with the invention shown in FIG. 13.

FIG. 14 depicts schematically a perspective view 450 of a gas mixing conduit 410 as depicted in FIG. 13. For the sake of clarity, view 450 depicts only a set of grooves 404, which form one gas mixing conduit 410. During utilization of gas mixing conduit to generate a gas mixture for delivery to a wafer processing station, overall gas flow is in the direction of gas flow arrow 454. Gas mixing conduit 410 comprises a plurality of eight gas inlet holes 411, eight corresponding gas inlet regions 412, a gas mixing region 413, a gas outlet region 414 and a gas outlet hole 415. Gas inlet holes 411 are operable to conduct gas into gas inlet regions 412, which are operable to conduct gas into gas mixing region 413. Gas outlet region 414 is operable to conduct mixed gas out of gas mixing region 413, and gas outlet hole 415 is operable to conduct a gas mixture from gas outlet region 414 out of conduit 410. For descriptive purposes, FIG. 14 depicts eight source gases, each source gas going into only one of gas inlet holes 411. It is to be noted that one of the eight source gases is itself a gas mixture, namely a mixture of $H_2$ and $N_2$.

In the particular embodiment of gas mixing conduit 410 depicted in FIG. 14, a portion 456 of gas mixing region 413 of gas mixing conduit 410 has a serpentine shape. The serpentine shape of portion 456 is operable to enhance mixing of the gases flowing through gas mixing conduit 410. The serpentine shape of portion 456 is also operable to increase the overall length of gas mixing conduit 410 and, thereby, the residence time of gases flowing through gas mixing conduit 410. In some embodiments, a long residence time is necessary to achieve complete mixing of the source gases that enter gas mixing conduit 410 through gas inlet holes 411 so that a gas mixture exiting gas mixing conduit 410 through gas outlet hole 415 is properly mixed. It is understood that in some embodiments, other structures and techniques (not shown) are utilized to achieve desired mixing behavior, desired residence time, desired pressure drops and desired flow rates within ranges of expected operating conditions. Such structures and techniques include, for example: selecting and fabricating the diameter of grooves 404; selecting the radius of bends in a gas mixing conduit; selecting the diameter and location of inlet holes of a conduit; inserting orifice plates in one or more locations of gas mixing conduit 410. In some embodiments, the diameter of the grooves forming gas mixing conduit 410 is narrower in one or more portions of gas mixing conduit 410 than in other portions. It is understood that in some embodiments, a gas mixing conduit comprises substantially no distinct gas inlet regions. Accordingly, in some embodiments, gas inlet holes lead substantially directly into a gas mixing region. It is understood that in some embodiments, a gas mixing conduit comprises substantially no distinct gas outlet region. In some embodiments, therefore, a gas outlet hole is operable to conduct a gas mixture substantially directly out of a gas mixing region.

Figure 15:
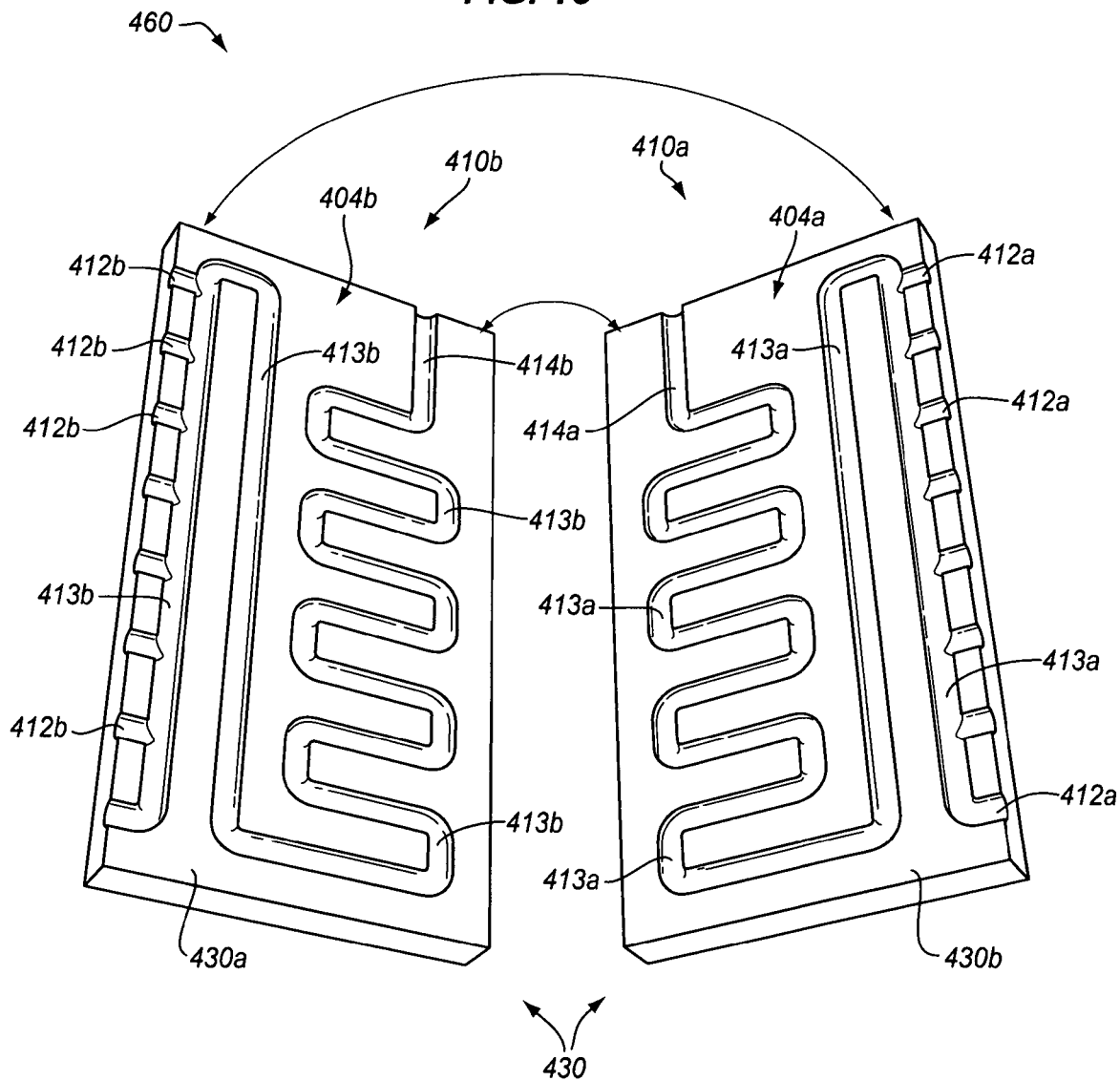
FIG. 15 depicts schematically a perspective view of a pair of grooved plates designed to form a gas mixing conduit in accordance with the invention.

FIG. 15 depicts schematically a perspective view 460 of a pair 430 of grooved plates that have been designed for use in manifold 400. Pair 430 of grooved plates comprise a plate 430a and a plate 430b. Grooved plates 430a and 430b of pair 430 are designed to be joined together (e.g., by screw bolts, not shown) to form a conduit 410, as depicted in FIGS. 9 and 10. In the exemplary embodiment depicted in view 460, grooves 404a and 404b in grooved plates 430a and 430b, respectively, comprise substantially one half of a gas mixing conduit 410; that is, grooves 404a comprise partial gas mixing conduit 410a and grooves 404b comprise partial gas mixing conduit 410b. Accordingly, grooves 404a include grooves 412a, 413a, and 414a, and grooves 404b include grooves 412b, 413b, and 414b. When plates 430a and 430b are joined together, grooves 412a and 412b form gas inlet holes 411 and gas inlet regions 412 (FIG. 14). Similarly, grooves 413a and 413b form gas mixing region 413 (FIG. 15), and grooves 414a and 414b form gas outlet region 414 and gas outlet hole 415 (FIG. 14). A pair of grooved plates 430 depicted in FIG. 15 is suitable to function as a conduit module with other conduit modules (e.g., as a module in a block 402) in a gas manifold section in accordance with the invention.

To prevent undesired gas leakage out of conduit 410, one or more sealing techniques known in the art of mechanical engineering and equipment design are utilized. An exemplary technique includes using one or more gaskets (not shown) located between plates 430a and 430b when the plates are joined together and applying a high pressure (e.g., by bolting the plates together). Another exemplary technique includes forming concave and convex ("male-female") surfaces that fit together at the edges of grooves 404a and 404b to create a sealing effect.

The word "conduit" is used in this specification to refer to an empty space located within a substantially solid block of material designed to provide a flow path for one or more gases. In contrast, the word "tube" as used in this specification is used in its usual sense in the prior art to refer to relatively thin material shaped to form a usually cylindrical inner space. The terms "block", "block of grooved material" and related terms are used in this specification in a broad sense to refer generally to a solid piece of a hard substance containing grooves, or more commonly, to an assembly of a plurality solid pieces that form a functional unit of solid material containing grooves in accordance with the invention. In some embodiments, a block (or assembly) of solid material in accordance with the invention comprises contiguous pieces of grooved solid material. In some embodiments, however, different pieces of a grooved block are physically separated. Although physically separated in some embodiments, different pieces of material forming a grooved block (or assembly) function together in a gas manifold in accordance with the invention. Generally, although not necessarily, one or more pieces of solid material in a block of grooved material in accordance with the invention have flat sides. The terms "grooves", "grooved" and related terms refer generally to cavities formed by removing material from a solid (in contrast to tubes and tubing, which are typically formed by shaping thin-walled material to form an inner space). Grooves in accordance with the invention are formed using one or more methods including, but not limited to, milling, routing, drilling and polishing. In some embodiments, a solid block of material is cross-drilled one or more times to form one or more cavities going completely through the block of material, and then one or more ends of the cavities are plugged so that only inlet holes and outlet holes remain unplugged. It is understood that in some embodiments in accordance with the invention, grooves are formed by stamping solid material or by molding solid material.

The terms "connectable", fluidically connectable", "connected" and related terms are used somewhat synonymously and broadly in this specification to refer either to a direct or to an indirect connection of structures through which a gas stream flows in accordance with the invention. For example, a gas inlet hole of a gas mixing conduit in accordance with the invention is typically "connectable" to a gas source, even though various other structures (such as a mass flow controller, a gas distribution duct, a gas filter, a gas inlet valve) may be located in a gas flow path between them. In this sense, the gas inlet hole is connected, but indirectly connected, to a gas source. Similarly, a gas outlet hole of a gas mixing conduit typically is "connectable" to a semiconductor processing station, even though various other gas flow structures are typically located between the gas mixing conduit and the processing station. As another example, in some embodiments, a gas inlet hole is more or less directly connectable or connected to a valve output of a gas inlet valve. An example of structures that are not "connectable" or "connected" in this sense are a plurality of gas distribution ports connected to a gas mixing conduit. Even though during normal operation a gas mixture stream in the gas mixing conduit flows past a plurality of gas inlet holes, each of which is connected to a gas distribution port, the gas mixture stream does not flow through the gas inlet holes or through the gas distribution ports. Therefore, the gas distribution ports are not "connectable" or "connected". In other words, just because a first element and a second element are connectable or connected (directly or indirectly) to a third element does not necessarily mean that the first and second elements are connected to each other.

The term "wafer processing station", "substrate processing station" and similar terms containing the word "station" are used broadly in this specification to refer generally to any location in one or more systems or apparatuses to which one or more gas streams is provided by a gas manifold in accordance with the invention. Accordingly, in some embodiments, a gas manifold in accordance with the invention is operable to provide one or more gas mixtures to a single station in a substrate processing apparatus, or one or more gas mixtures to a plurality of stations in a single chamber of a substrate processing apparatus, or one or more gas mixtures to one or more stations in one or more processing chambers in one or more substrate processing apparatuses.

Gas manifolds are described in this specification generally as being operable to provide a plurality of gas streams having different compositions and gas flow rates. Although embodiments of the invention are described herein mainly with reference to semiconductor wafer processing stations, it is understood that gas manifolds in accordance with the invention are useful to provide gas mixtures to a variety of different types of processing stations for processing different types of substrates in a wide variety of manufacturing and processing settings. Examples of areas of substrate processing in which gas manifolds in accordance with the invention are useful include: fabrication of flat-panel displays; treatment and processing of optical substrates; fabrication of solar panels; and impregnation (doping) of substrates using gas mixtures.

Figure 16:
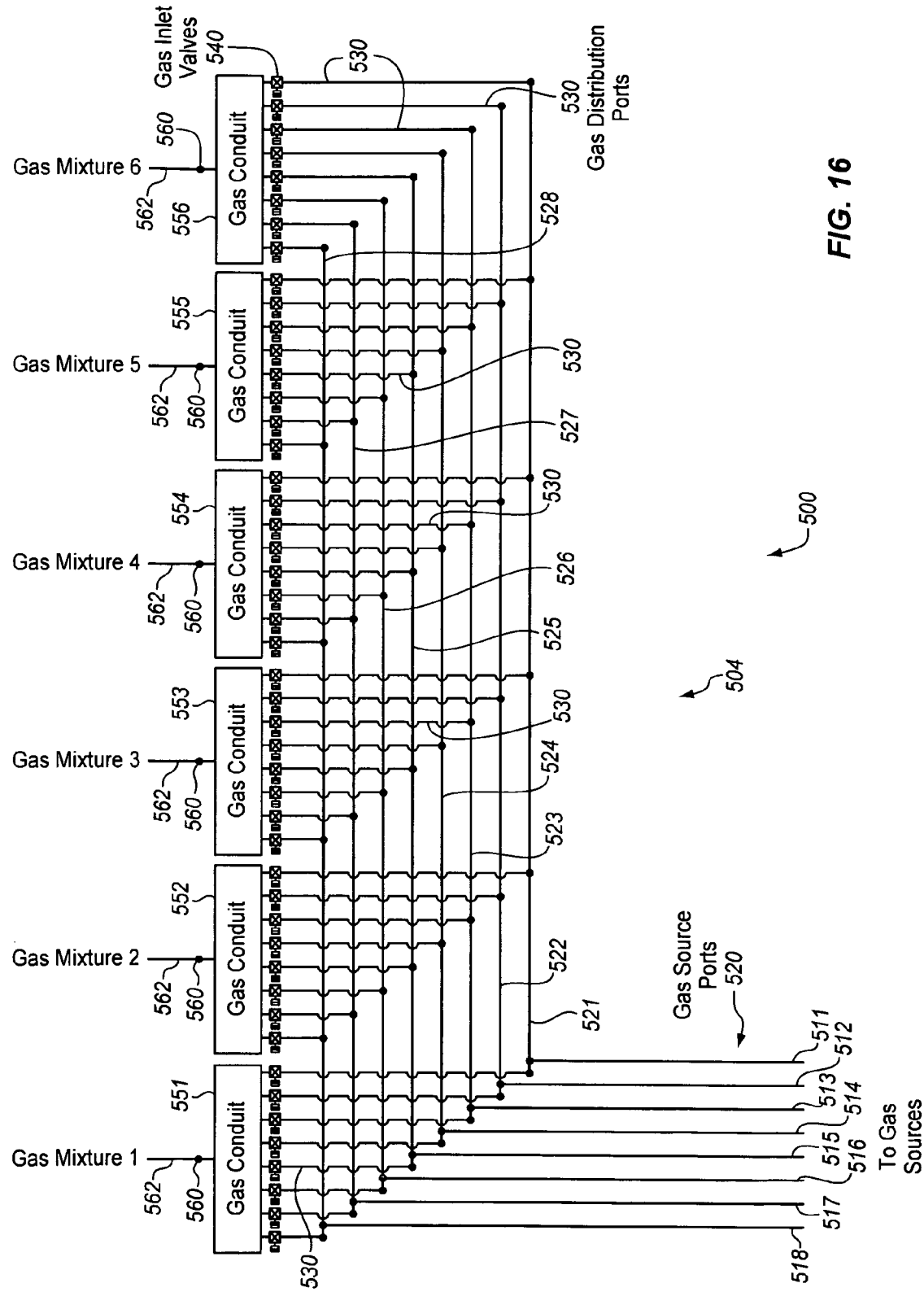
FIG. 16 depicts a process flow diagram of a manifold system that corresponds substantially to the manifold system described with reference to FIG. 13.

FIG. 16 depicts a system flow diagram 500 of a manifold system 504 that corresponds substantially to manifold systems 300 and 402 described above with reference to FIGS. 5 and 9, respectively. Manifold system 504 comprises eight gas distribution ducts 521-528, each of which are connectable via a gas source port 520 to a gas source, for example, to gas sources 511-518, respectively. System 504 further comprises six gas mixing conduits 551-556. Each of gas distribution ducts 521-528 comprises a plurality of six gas distribution ports 530. Each gas distribution port 530 is connectable to a valve input of one of gas inlet valves 540. In accordance with the invention, each gas mixing conduit 551-556 comprises eight gas inlet holes (such as inlet holes 411 depicted in FIG. 14). Each of eight gas inlet holes of each of the gas mixing conduits is connectable to a valve output of one of gas inlet valves 540. In accordance with the invention, each gas mixing conduit 551-556 comprises a gas outlet hole (such as gas outlet hole 415 depicted in FIG. 14). The gas outlet hole of each of the six gas mixing conduits 551-556 is connectable via a manifold mixture delivery port 560 to a corresponding station mixture flow path 562, which is operable to provide a gas mixture to a semiconductor processing station. In some embodiments, each station mixture flow path 562 conducts a gas mixture to a processing station separate from other processing stations. In some embodiments, two or more of station mixture flow paths 562 conduct their corresponding gas mixtures to the same processing station. In preferred embodiments, however, each station mixture flow path 562 comprises only one flow channel, and the flow channel has no intersections with other gas flow channels between the gas mixing conduit and a processing station.

Accordingly, manifold system 504 includes a total of 48 gas distribution ports 530 and 48 gas inlet valves 540. It is understood that other embodiments in accordance with the invention include less than six gas mixing conduits or more than six gas mixing conduits. It is also understood that in some embodiments of a system 504, less than eight gas sources are utilized, or more than eight gas sources are utilized. It is further understood that in some embodiments having m-number of gas mixing conduits and n-number of gas distribution ducts for distributing n-number of source gases, the gas manifold system is adapted to deliver less than n-number of gases to some of the gas mixing conduits, so that the manifold system includes less than m multiplied by n (m×n) gas inlet valves. It is understood that other structures and devices well known in the art of gas delivery systems typically are utilized with embodiments in accordance with the invention, such as with manifold system 504. Although not depicted in view 500 of FIG. 16, exemplary structures and devices well known in the art include mass flow controllers, volume flow controllers, gas filters, and on-off valves. For example, in some embodiments in accordance with the invention, a mass flow controller is located in the gas flow path between a gas source and a gas source port 520 of a gas distribution duct. In some embodiments, a mass flow controller functions to control the flow rate of a particular source gas through a gas distribution duct toward one or more gas mixing conduits. In some embodiments, a mass flow controller functions together with the particular geometry of a gas distribution duct and of one or more gas mixing conduits to control the flow rate of a particular gas to the conduits and, thereby, the flow rate and composition of gas mixtures generated in the conduits.

The term 'continuous" is used in this specification to refer to a gas flow path that in the normal direction of gas flow during operation does not split up into two or more paths. Continuous also means that the flow path does not combine with or intersect other gas flow paths. A feature of a manifold in accordance with the invention is a plurality of continuous flow paths leading to one or more substrate processing stations. For example, as depicted in FIG. 16, gas mixing conduit 551 together with a station mixture flow path 562 forms a continuous gas flow path to a substrate processing station.

Gas mixing conduits in accordance with the invention formed by grooved material reduce or eliminate problems associated with metal tubing in conventional manifolds of the prior art. Unless expensive customized tubing is used, metal tubing of the prior art is generally limited to standard diameters of capillary tubing; for example, ¼ inch (0.635 cm), ⅜ inch (0.953 cm), and ½ inch (1.27 cm). The cutting and fitting of metal tubing in the prior art is time-consuming and expensive, and it requires the inconvenient use of welded joints and threaded joints, which influence gas flow in ways that are difficult to model and to predict. In contrast, using gas mixing conduits formed by grooved material, it is relatively easy to design and to manufacture gas mixing conduits to provide gas mixtures having desired ranges of gas flow rates and gas mixture composition. Using mathematical modeling techniques well known in the art, it is relatively easy and inexpensive to design a gas mixing conduit and a plurality of gas mixing conduits in a manifold so that each conduit influences in a desired manner the total gas flow rate and the composition of the gas mixture at each of the plurality of outlets of the manifold. A particular conduit may be designed to have virtually any geometry suitable to obtain desired gas flow and mixing characteristics, including various combinations of length, shape, and varying conduit diameters. Conduit grooves are then formed in the material using techniques known in the art. In some embodiments, as depicted in FIG. 15, each plate of a pair of plates is machined to form a set of interconnected grooves that is substantially a mirror image of the grooves in the other plate of the pair, and each set of grooves represents approximately one half of the gas mixing conduit when the plates are joined. Of course, in some embodiments, other suitable techniques are used to form grooves in material.

Because grooved gas channels in accordance with the invention, such as grooved gas mixing conduits and grooved gas distribution ducts, do not include tubes having threaded and welded joints and connections, the grooved channels are less prone to formation of solid deposits in the gas flow paths. Also, when cleaning is necessary, grooved channels are generally easier to clean than gas tubing known in the prior art. For example, in gas manifold systems such as gas manifold 400 depicted in FIG. 13, modular plates 430 are simply opened up (as depicted in FIG. 15), grooves 404 are cleaned using any of a variety of suitable cleaning techniques known by one of ordinary skill in the art, and then reassembled in gas manifold block 402.

Figure 17:
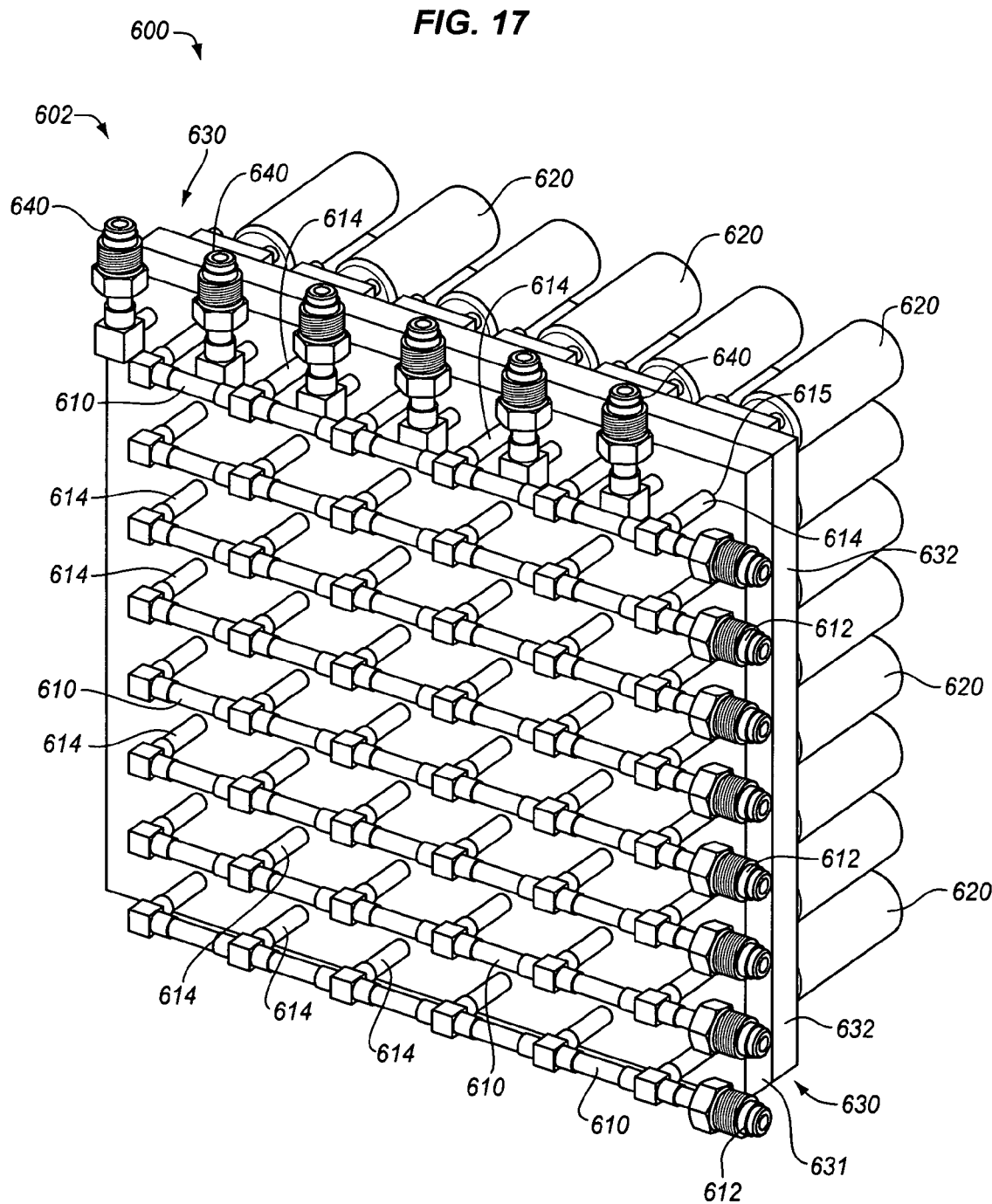
FIG. 17 depicts schematically a view of a gas manifold in accordance with the invention.

FIG. 17 depicts schematically a view 600 of a gas manifold 602 in accordance with the invention. Manifold 602 comprises eight gas distribution ducts 610 comprising metal tubes. Each of gas distribution ducts 610 includes a gas source port 612 and six gas distribution ports 614. Manifold 602 further includes 48 gas inlet valves 620. Each gas inlet valve 620 comprises a valve input (not shown) and a valve output (not shown). Manifold 602 further comprises a grooved block of material 630 that contains six sets (not shown) of interconnected grooves, each set of interconnected grooves designed to form a gas mixing conduit (not shown). In the particular embodiment of manifold 602 depicted in FIG. 17, block 630 comprises a grooved plate 631 and a valve mounting plate 632. In accordance with the invention and described below with reference to FIG. 18, each gas mixing conduit comprises eight gas inlet holes, a gas mixing region, a gas outlet region, and a gas outlet hole. Each gas inlet hole is connectable to a gas source through a gas inlet valve 620 and a gas distribution duct 610. Each gas outlet hole is connectable to a semiconductor processing station through one of six manifold mixture delivery ports 640. Each of the six gas mixing conduits is operable to receive a plurality of up to eight source gases, one gas at each of its eight gas inlet holes, to mix the plurality of source gases to generate a gas mixture, and to provide the gas mixture to a semiconductor processing station through its gas outlet hole and a corresponding manifold mixture delivery port 640.

Each gas source port 612 is connectable to a gas source, and each gas distribution port 614 is connectable to a valve input of one of gas inlet valves 620. Each gas distribution port 614 is connected to a valve input through a gas distribution port hole 615 passing through grooved block 630 (i.e., through grooved plate 631 and valve mounting plate 632). Each of the gas inlet holes of each of the gas mixing conduits is connectable to a valve output of one of gas inlet valves 620. In some embodiments, gas inlet valves 620 are surface mounted, preferably to a surface of block 630, typically to valve mounting plate 632, as depicted in FIG. 17. Examples of commercially-available surface-mounted valves suitable for use in accordance with the invention include: Fujikin W-seal IGS (integrated gas system) valves available from Fujikin of America, Inc., Santa Clara, Calif. It is understood that embodiments in accordance with the invention may be designed to process any number of source gases to provide any number of gas mixtures. Accordingly, a generalized gas manifold in accordance with the invention comprises n-number of gas distribution ducts and m-number of grooved gas mixing conduits, wherein each gas distribution duct comprises up to m-number of gas distribution ports, each gas mixing conduit comprises up to n-number of gas inlet holes, and the manifold comprises up to m×n gas inlet valves.

System flow diagram 500 of manifold system 504 described above with reference to FIG. 16 also represents the gas flow scheme of manifold 602.

Figure 18:
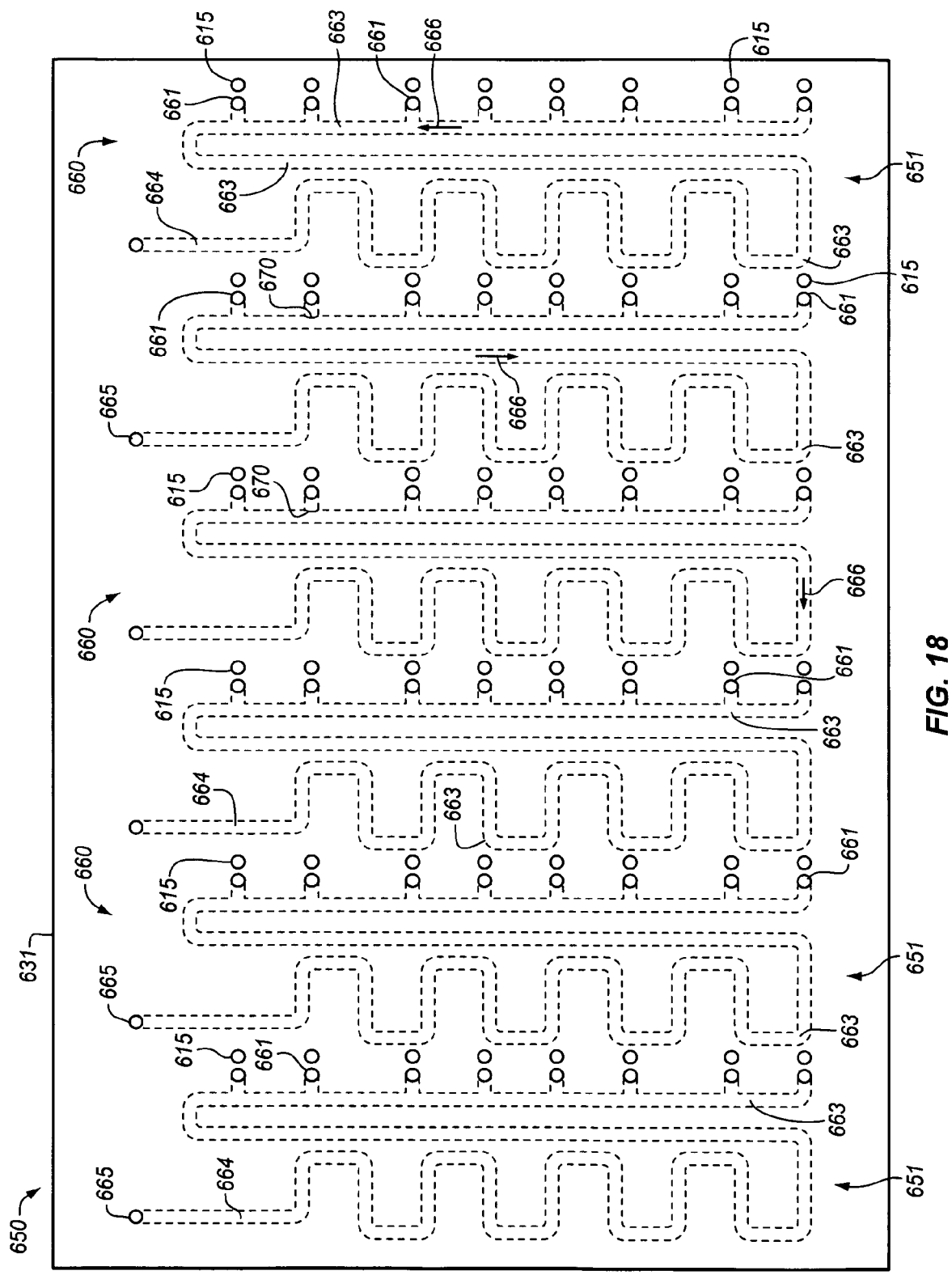
FIG. 18 depicts schematically an inside view of a grooved plate in accordance with the invention having six sets of substantially identical grooves for forming six gas mixing conduits.

FIG. 18 depicts schematically an inside view 650 of grooved plate 631, which is part of gas manifold 602 described above with reference to FIG. 17. Grooved plate 631 comprises six sets of interconnected grooves 651, each set of interconnected grooves designed to form a gas mixing conduit in accordance with the invention when grooved plate 631 is joined with valve mounting plate 632 to form grooved block 630, as depicted in FIG. 17. Gas mixing conduits 660 are located in substantially the same plane. Each of the six gas mixing conduits 660 corresponding to grooves 651 comprises eight gas inlet holes 661, a gas mixing region 663, a gas outlet region 664 and a gas outlet hole 665. As depicted in FIG. 18, grooved plate 631 includes a plurality of gas distribution port holes 615, described above with reference to FIG. 17. Gas mixing conduits 651 are designed so that during operation, each of gas holes 661 is operable to conduct a source gas into a conduit toward gas mixing region 663 in the direction of gas flow indicated by arrows 665, and each gas mixing region 663 is operable to conduct a gas mixture toward a gas outlet hole 665. In some embodiments as depicted in FIG. 18, the grooves 651 corresponding to the gas mixing conduits have substantially identical dimensions. As depicted in FIG. 18, gas mixing region 663 of gas mixing conduits 660 includes a serpentine shape and in some embodiments is designed to accommodate a particular desired range of gas mixture compositions and flow rates. In addition to or instead of shape, other variables typically utilized in designing gas mixing conduits include groove length and diameter. Within practical limitations, a combination of geometric dimensions of gas inlet holes 661, gas mixing regions 663, gas outlet regions 664 and gas outlet holes 665 of all of the gas mixing conduits of the manifold system may be designed and selected to manufacture or to modify a gas manifold having desired gas mixing characteristics. For example, as depicted in FIG. 18, orifice plates 670 adapted for use in accordance with the invention are located in several conduits 660. In accordance with the invention, gas mixing regions 663 formed by grooves 651 include no threaded joints. Similarly, gas mixing regions 663 formed by grooves 651 include no welded joints. In some embodiments, grooves 651 in assembled block 630 are not cylindrical. In some embodiments, the inside surface of valve mounting plate 632 contains no grooves, so that only grooved plate 630 contains grooves.

To prevent undesired gas leakage out of and between gas mixing conduits 660, one or more sealing techniques known in the art of mechanical engineering and equipment design are utilized. An exemplary technique includes using one or more gaskets (not shown) located between plates when the plates 631 and 631 are joined together and applying a high pressure (e.g., by bolting the plates together). Another exemplary technique includes forming concave and convex ("male-female") surfaces in the matching plates, which concave-convex surfaces fit together at the edges of each set of grooves 651 to create a sealing effect.

Figure 19:
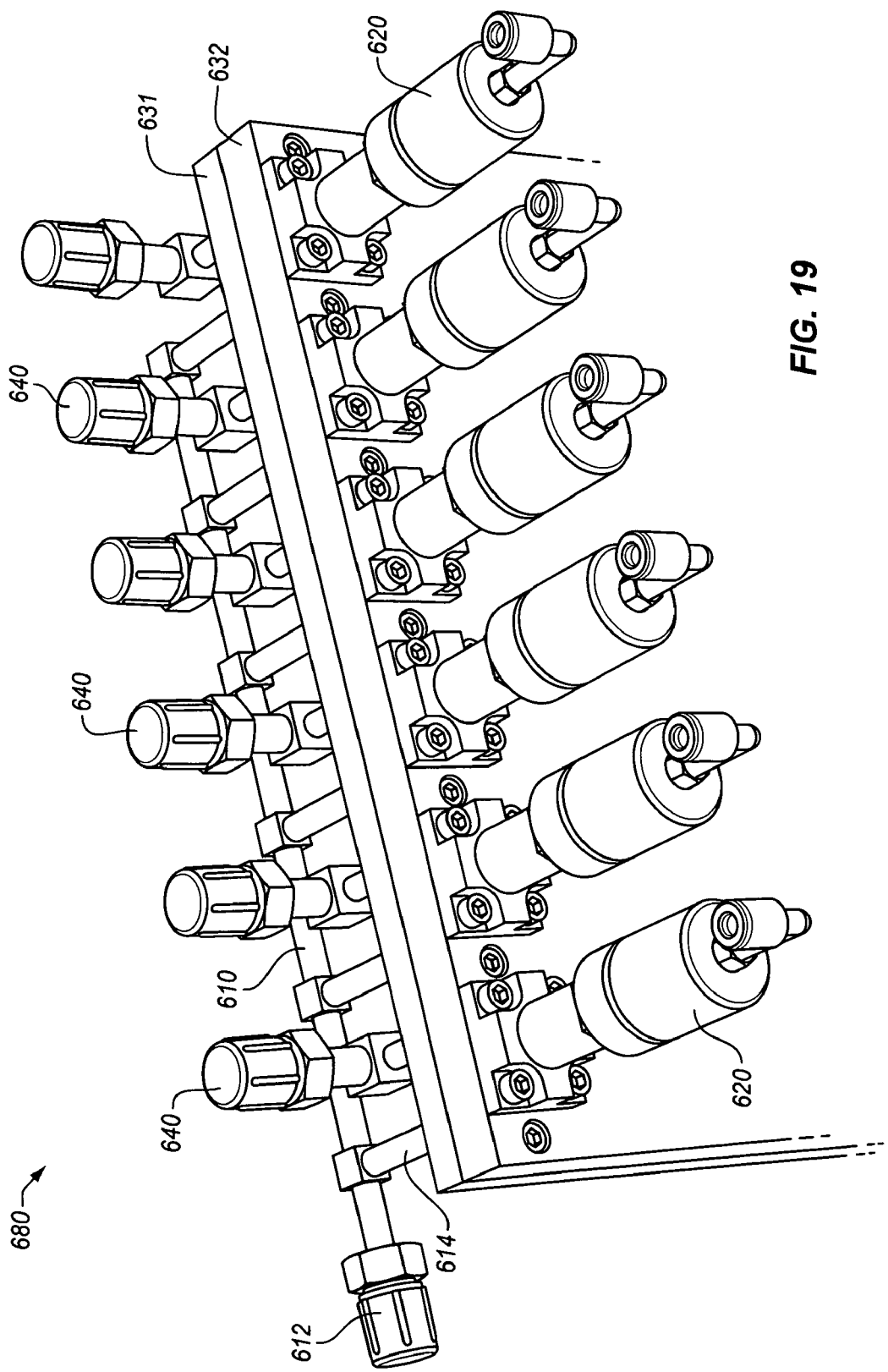
FIG. 19 depicts schematically a perspective view of the valve mounting plate plate of the gas manifold described above with reference to FIG. 17.

FIG. 19 depicts schematically a perspective view 680 of the top row of inlet valves 620 on valve mounting plate 632 of grooved block 630 described above with reference to FIGS. 17 and 18. (For the sake of clarity, only one row of valves is depicted.) View 680 depicts six inlet valves 620, which are surface mounted to valve mounting plate 632. View 680 further depicts the top tubular gas distribution duct 610 of eight gas distribution ducts depicted in FIG. 17, as well as its corresponding gas source port 612 and six gas distribution ports 614. View 680 further depicts six manifold mixture delivery ports 640.

Figure 20:
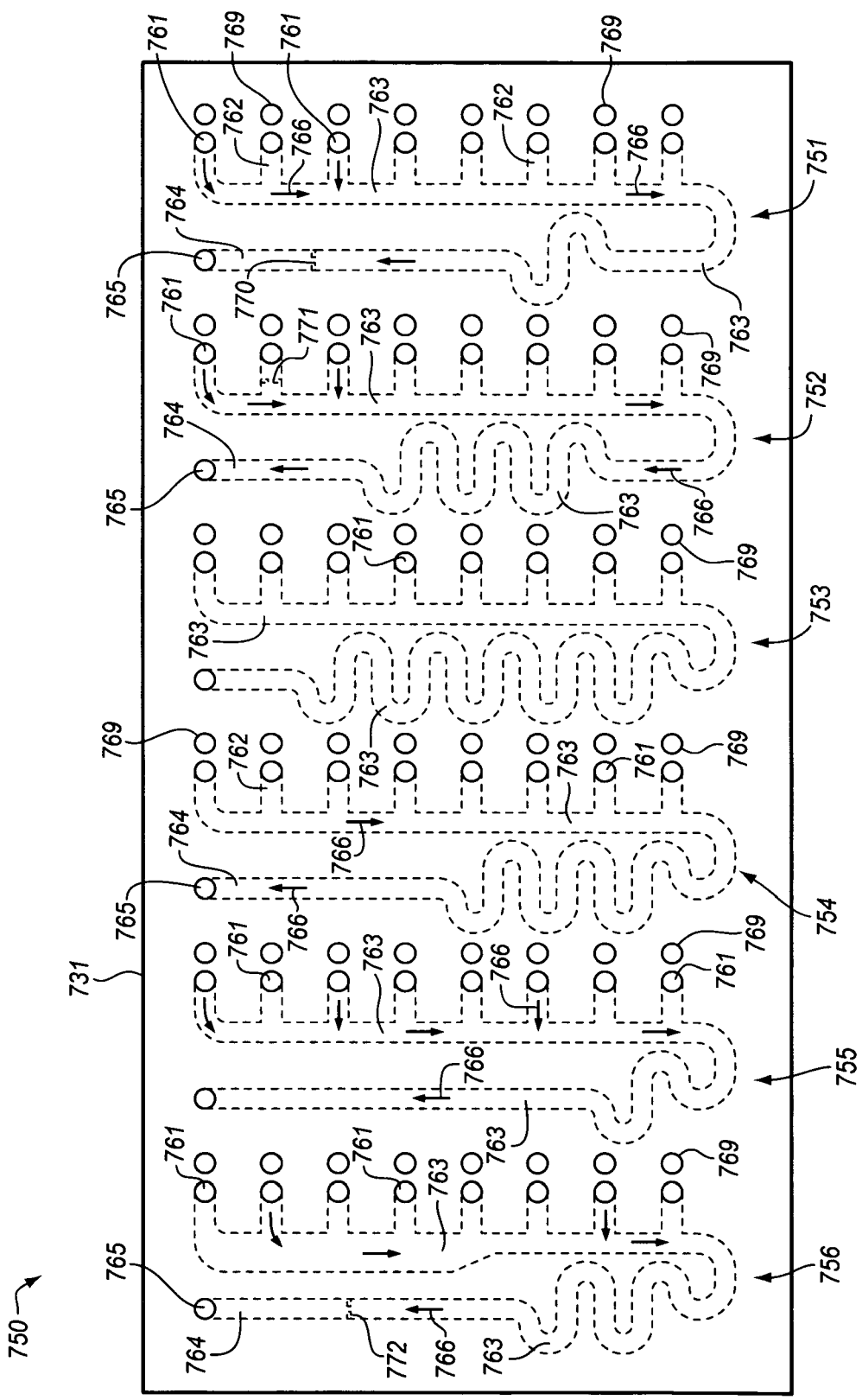
FIG. 20 depicts schematically an inside view of a grooved plate in accordance with the invention having six sets of non-identical grooves for forming six gas mixing conduits.

FIG. 20 depicts schematically an inside view 750 of grooved plate 731, which forms part of an alternative gas manifold (not shown). Grooved plate 731 comprises six sets 751-756 of interconnected grooves, each set of interconnected grooves designed to form a gas mixing conduit in accordance with the invention when grooved plate 731 is joined with a mounting plate to form a grooved block; for example, such as grooved block 630 as described with reference to FIG. 17. Each of the six gas mixing conduits designated by reference numerals 751-756 comprises eight gas inlet holes 761, eight corresponding gas inlet regions 762, a gas mixing region 763, a gas outlet region 764 and a gas outlet hole 765. Grooved plate further includes a plurality of gas distribution port holes 769, similar to gas distribution port holes 615 described above with reference to FIGS. 15-16. Gas mixing conduits 751-756 are designed so that during operation, each of gas holes 761 is operable to conduct a source gas into a conduit toward gas mixing region 763 in the direction of gas flow indicated by arrows 766, and each gas mixing region 763 is operable to conduct a gas mixture toward a gas outlet hole 765. As depicted in FIG. 20, grooves 751-756 in plate 731 have different geometric dimensions in order to generate gas mixtures provided at outlet holes 765 that have different gas mixture compositions and different flow rates. As depicted in FIG. 20, gas mixing region 763 of each of gas mixing conduits 751-756 includes a unique serpentine shape and typically is designed to generate a particular desired range of gas mixture compositions and flow rates. In addition to or instead of shape, other variables typically utilized in designing gas mixing conduits and their corresponding grooves include groove length and diameter. Within practical limitations, a combination of geometric dimensions of gas inlet holes 761, gas inlet regions 762, gas mixing regions 763, gas outlet regions 764 and gas outlet holes 765 of all of the gas mixing conduits of the manifold system may be designed and selected to manufacture or to modify a gas manifold having desired gas mixing characteristics. For example, as depicted in FIG. 20, orifice plates 770, 771 and 772 adapted for use in accordance with the invention are located in conduits 751, 752 and 756, respectively. In gas mixing region 763 of exemplary grooves 756, the diameter of the grooves and of the resulting gas mixing conduit varies along the length of the gas flow path. In accordance with some preferred embodiments of the invention, gas mixing regions 763 formed by grooves 751-756 include no threaded joints. Similarly, gas mixing regions 763 formed by grooves 751-756 include no welded joints. The shape and dimensions of gas mixing conduits 751-756 may also be individually selectively designed and modified to influence the composition and flow rate of corresponding gas mixtures.

Figure 21:
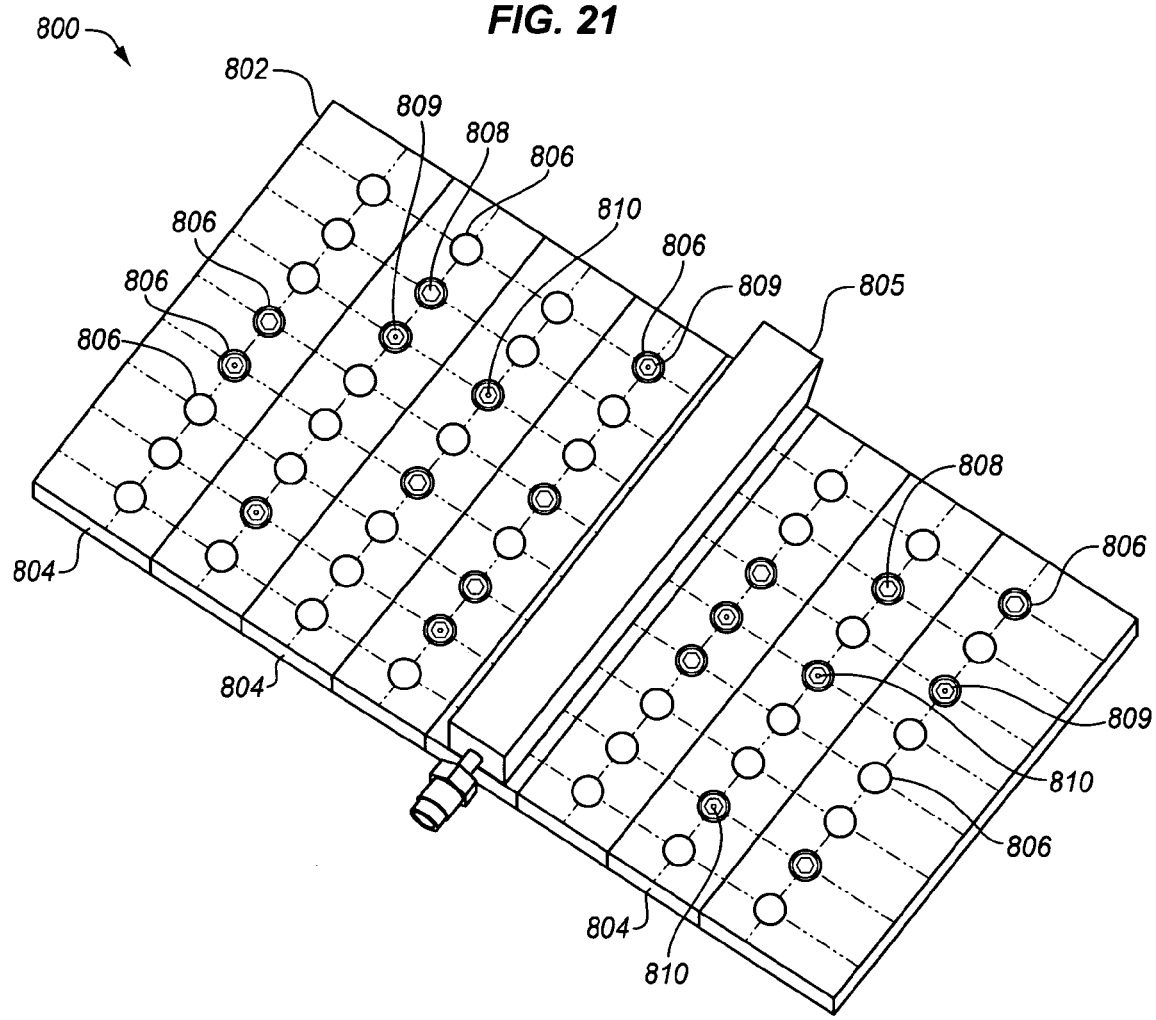
FIG. 21 depicts schematically a perspective view of a mounting plate 802 in accordance with the invention.

FIG. 21 depicts schematically a perspective view of a mounting plate 802 in accordance with the invention. A mounting plate 802 functions in a manner somewhat similar to mounting plate 305 described above with reference to FIG. 5 and to mounting plate 342 described above with reference to FIG. 9. Mounting plate 802 comprises eight plate sections 804, each of which is designed for mounting of a corresponding gas distribution strip 805 in accordance with the invention. Mounting plate 802 is further designed for mounting of gas mixing conduits, such as gas mixing conduits 310 described with reference to FIGS. 5 and 6. In some embodiments, a gas distribution strip 805 is similar to gas distribution strip 354*c* depicted in FIG. 10B, which has a gas distribution duct in accordance with the invention and a plurality of gas distribution ports 356, one port 356 for each of a plurality of source gases. Each plate section 804 of mounting plate comprises eight gas inlet apertures 806. A gas inlet aperture 806 serves to provide a passage through mounting plate 802 for a source gas from one of eight gas distribution strips 805 into a gas inlet hole (e.g., into a gas inlet hole 311 depicted in FIG. 8A) of a gas mixing conduit in accordance with the invention. Thus, each plate section 804 is designed to provide a passage for a particular source gas to a given number of up to eight gas mixture flow paths. A feature of gas distribution strip 805 is that zero, one, a plurality or all of gas inlet apertures 806 are designed to accept either a blocking plug 808 or an orifice plug 809. A blocking plug 808 mounted in a gas inlet aperture 806 serves to block completely flow of a source gas through the particular aperture, thereby blocking flow of a particular source gas into a corresponding gas mixture conduit. An orifice plug 809 comprises an orifice 810 through the plug. The size of an orifice 810 in a particular orifice plug 809 can be designed to control flow of a source gas through a gas inlet aperture 806 in a desired manner. An orifice plug 809 assembled in a gas inlet aperture 806 serves to control the flow of a source gas through the gas inlet aperture into the gas inlet hole of a gas mixing conduit. Of course, plugs 808, 809 are designed to not interfere with the connection of a gas distribution duct to gas inlet apertures. A gas manifold in accordance with the invention comprising a mounting plate 802 and a corresponding set of gas distribution strips 805 provides a high degree of flexibility regarding gas mixture composition (gas components and their concentrations) and gas mixture flow rate. Plugs can be easily switched in an out of the gas inlet apertures to change the flow rates and compositions of the various gas mixtures. Also, a manifold including mounting plate 802 and gas distribution strips 805 does not require gas inlet valves, such as gas inlet valves 324, which can be relatively expensive. For a given use application, the flow of each source gas to each gas mixing conduit is controllable within wide ranges by inserting in each gas inlet aperture 806 an orifice plug 809 having an orifice 810 of selected size, a blocking plug 808, or no plug. In such an embodiment, gas distribution strips 805 may be standardized to provide fluidic connection of a particular source gas to all of a plurality of gas mixing conduits (e.g., as provided by gas distribution strip 354*c* depicted in FIG. 10B), while actual flow of each source gas to a particular gas mixing conduit is controlled (at least partially) by the presence or absence of plugs 808, 809.

As depicted in FIG. 21, a plurality of gas inlet apertures 806 are plugged by a blocking plug 808 or an orifice plug 809. Although apertures 806, on the one hand, and plug orifices 810, on the other hand, shown in FIG. 21 are depicted as having identical dimensions, it is understood that in some embodiments, one or more of a plurality of individual gas inlet apertures 806 and/or orifices 810 have different geometries and/or dimensions, which are selected to influence the gas flow rate of a particular source gas into a particular gas mixture flow path. For example, a particular gas inlet aperture 806 may be relatively large and present substantially no resistance to gas flow, whereas another gas inlet aperture 806 may be a laser-drilled orifice presenting substantial resistance to gas flow. In some embodiments, plate sections 804 are modular; that is, any of the plate sections may be switched out and replaced with another section, for example, with a section having more or less gas inlet apertures, or gas inlet apertures having different dimensions. In some embodiments, gas mounting plate comprises substantially one contiguous plate of material. In some embodiments, gas mounting plate comprises an assembly of a plurality of pieces. Also, for example, some embodiments do not include a separate gas distribution strip 805 for each gas distribution conduit; rather the gas distribution conduits are assembled in the manifold and connected to gas inlet apertures 806 using one or several hardware configurations recognized by one skilled in the art.

Figure 22:
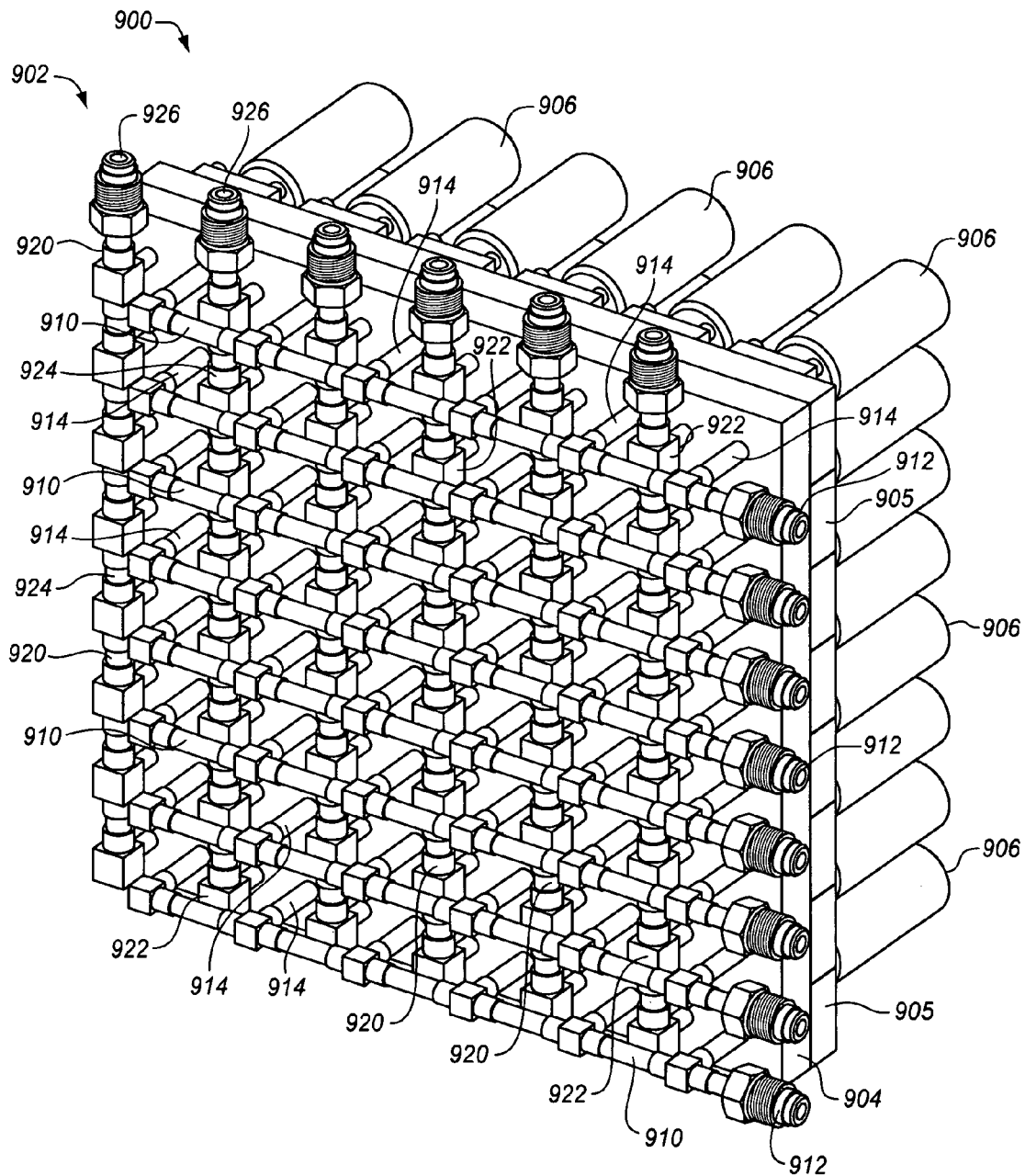
FIG. 22 depicts schematically a perspective view of a flexible gas mixing manifold in accordance with the invention.

FIG. 22 depicts schematically a view 900 of a gas manifold 902 in accordance with the invention. Gas manifold 902 comprises a mounting plate 904 in accordance with the invention. A mounting plate 904 functions in a manner similar to mounting plate 305 described above with reference to FIG. 5 and to mounting plate 802 described above with reference to FIG. 21 except in gas manifold 902 gas distribution ducts and gas mixing conduits are mounted onto the same side of mounting plate 904. Mounting plate 902 is designed for assembly with valve mounting strips 905. Mounting plate comprises 48 gas inlet apertures (not shown), similar to gas inlet apertures 810 depicted in FIG. 21. Manifold 902 further includes 48 gas inlet valves 906, preferably surface mounted on valve mounting strips 905. Each gas inlet valve 906 comprises a valve input (not shown) and a valve output (not shown), similar to gas inlet valves 324 described above with reference to FIG. 7. Gas manifold 902 further comprises eight gas distribution ducts 910 comprising metal tubes. Each of gas distribution ducts 910 includes a gas source port 912 and six gas distribution ports 914.

Gas manifold 902 includes six gas mixing conduits 920 (oriented vertically in FIG. 22), each having a length of about eight inches and comprising metal tubing with an inside diameter of 0.299 inches. Each of gas mixing conduits 920 is shown assembled on mounting plate 904 and comprises up to eight gas inlet holes corresponding to gas inlet joints 922 (similar to gas inlet joints 311a described with reference to FIG. 5), a gas mixing region 924, and a gas outlet hole 926. Gas mixing conduits 920 are designed so that during operation, each of the gas inlet holes is operable to conduct a source gas into a conduit 920 toward gas mixing region 924, and the gas mixing region 924 is operable to conduct a gas mixture toward gas outlet hole 926. Each gas inlet joint 922 depicted in FIG. 22 corresponds to a gas inlet hole, such as a gas inlet hole 311 depicted in FIG. 6. In some embodiments, all of gas mixing conduits 920 are substantially identical. In some embodiments, however, at least two of gas mixing conduits 920 are substantially non-identical. This commonly occurs in embodiments in which manifold 902 is utilized to generate a plurality of non-identical gas mixtures. It is understood, however, that commonly an embodiment in accordance with the invention is operable to generate a plurality of gas mixture streams having non-identical gas mixture compositions even when gas mixing conduits 920 are substantially identical. Each of gas outlet holes 926 is connectable to a semiconductor wafer processing station (not shown).

In some embodiments, as depicted in FIG. 22, gas mixing regions 924 include welded joints and no threaded joints. In some embodiments, gas mixing regions 924 include no welded joints and no threaded joints. In some embodiments, gas mixing regions 924 substantially comprise bent tubing, for example, bent stainless steel tubing. In some embodiments (not depicted), one or more gas mixing regions 924 include welded joints and/or threaded joints. Gas mixing conduits 920 in manifold 900 are substantially straight and have a relatively short length (e.g., about eight inches) compared to gas mixing conduits in other embodiments described herein. Gas mixing conduits having a relatively short length are useful in applications that do not require the longer lengths preferred for mixing gas mixtures in which relative concentrations of various gas components differ greatly. For example, in some embodiments, the difference in flow rates of the various source gases in a desired gas mixture is less than an order of magnitude. Such applications do not necessarily require gas mixing conduits having a long total length, such as gas mixing conduit 310 depicted in FIG. 8A.

Each gas source port 912 is connectable to a gas source, and each gas distribution port 914 is connectable to a valve input of one of gas inlet valves 906. Each gas distribution port 914 is connected to a valve input through a gas distribution port hole passing through mounting plate 904. Each of the gas inlet holes of each of the gas mixing conduits is connectable to a valve output of one of gas inlet valves 906.

Figure 23:
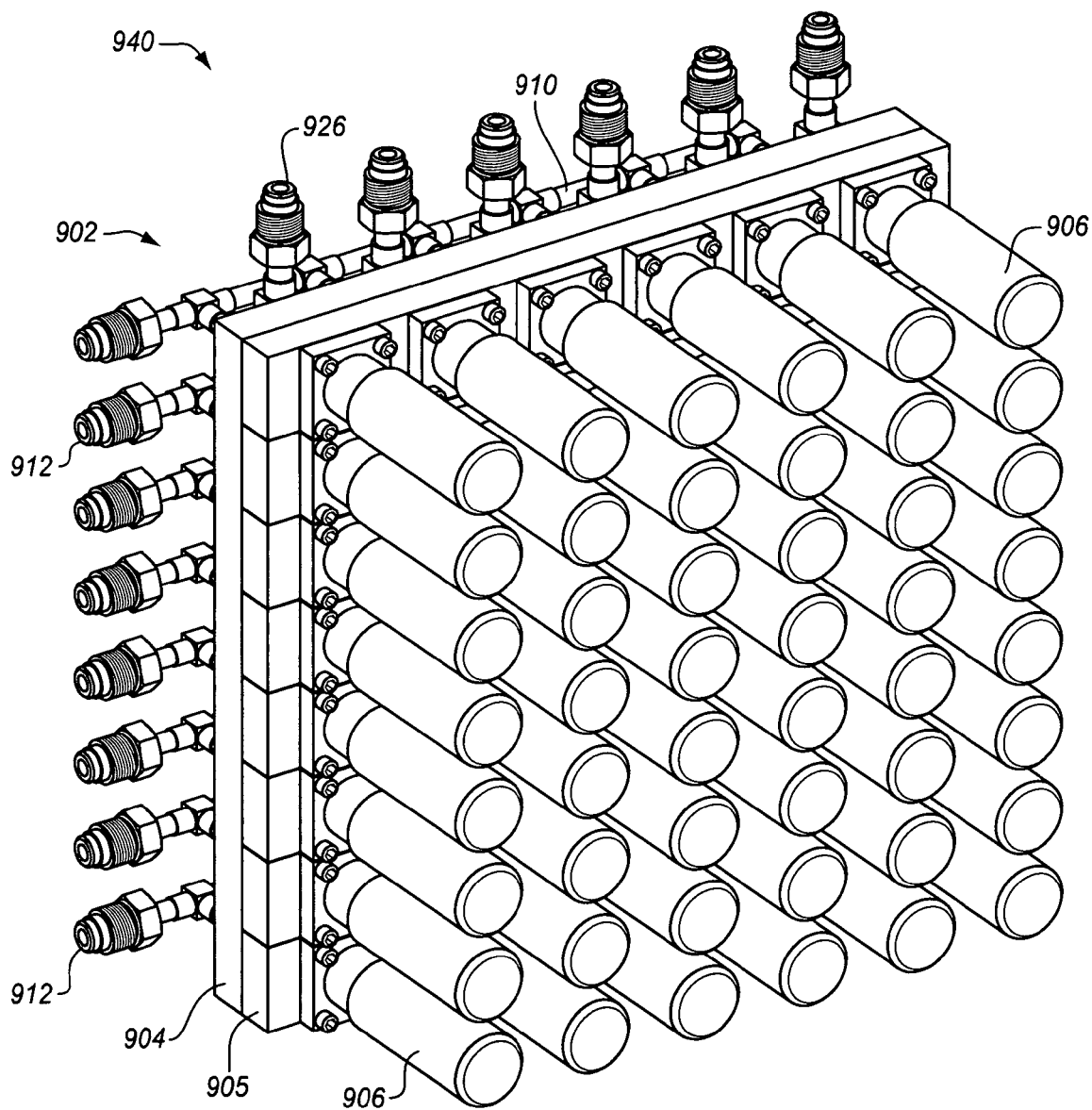
FIG. 23 depicts schematically a valve-side perspective view of the flexible gas mixing manifold described with reference to FIG. 22.

FIG. 23 depicts schematically valve-side view 940 of flexible gas mixing manifold 902 described with reference to FIG. 22, in which gas inlet valves 906 are surface mounted on valve mounting strips 905.

In some embodiments (not shown), mounting plate 904 is designed and configured similarly to mounting plate 802 of FIG. 21, and valve mounting strips 905 and gas inlet valves 906 are eliminated. Instead of being connected to an inlet valve, each gas distribution port 914 is fluidically connected through mounting plate 904 with a corresponding inlet hole of a gas mixing conduit, and the flow of a particular source gas through the gas inlet apertures of a mounting plate to a particular gas mixing conduit 920 is controlled by the absence or presence of a flow restricting device, such as a blocking plug 808 or an orifice plug 809, described above with reference to FIG. 21.

Methods and systems in accordance with the invention are useful in a wide variety of circumstances and applications. It is evident that those skilled in the art may now make numerous uses and modifications of the specific embodiments described, without departing from the inventive concepts. For example, embodiments were described having gas distribution ducts and gas mixing conduits in accordance with the invention. Nevertheless, it is understood that one or more gas flow paths or gas flow channels not in accordance with the invention may be assembled and/or utilized together with embodiments within the scope of the invention. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the methods and structures described in the claims below and by their equivalents.

The invention claimed is:

1. A gas manifold, comprising:
M gas distribution ducts each including:
 a gas source port to receive a gas source;
 a gas flow path connected to the gas source port;
 1 to N gas distribution ports connecting the gas flow path to 1 to N gas valves, respectively; and
 1 to N valve outlets connecting the 1 to N gas valves to 1 to N valve outlet ports,
 wherein N and M are integers greater than three, and
 wherein at least one of said M gas distribution ducts includes N distribution ports, N valve outlets and N valve outlet ports;
a mounting plate including an M×N array of gas inlet holes, wherein said M gas distribution ducts are connected to a first side of said mounting plate, and wherein each row of the array of gas inlet holes corresponds to one of said M gas distribution ducts;

N gas mixing conduits connected to each including:
- 1 to M gas inlet holes connected to a second side of the mounting plate in locations corresponding to one column of valve outlets of said M gas distribution ducts; and
- a gas mixing region including a first portion connected to the 1 to M gas inlet holes and extending from a first end of said mounting plate to a second end of said mounting plate, a second portion connected to said first portion and extending from said second end to said first end, and a third portion connected to said second portion and extending from said first end to said second end; and
- a gas outlet hole connected to said third portion.

2. The gas manifold of claim 1 wherein each of said N gas mixing conduits receives two or more source gases by receiving a single source gas from two or more of said M gas distribution duct.

3. The gas manifold of claim 2 wherein each of said M gas distribution ducts is operable to distribute a single source gas to one or more of a plurality said N gas mixing conduits.

4. The gas manifold of claim 2 wherein said gas manifold provides a gas mixture in a gas mixture stream from a plurality of said N gas mixing conduits to a substrate processing station without combining said gas mixture stream with another gas stream.

5. The gas manifold of claim 4 wherein said gas manifold provides said gas mixture in said gas mixture stream from a plurality of said N gas mixing conduits to said substrate processing station without splitting said gas mixture stream.

6. The gas manifold of claim 2 wherein said gas manifold provides a gas mixture in a gas mixture stream from all of said N gas mixing conduits to a substrate processing station without combining said gas mixture stream with another gas stream.

7. The gas manifold of claim 6 wherein said gas manifold provides said gas mixture in said gas mixture stream from all of said N gas mixing conduits to said substrate processing station without splitting said gas mixture stream.

8. The gas manifold of claim 2 wherein said gas manifold:
- generates a gas mixture in each of a plurality of said N gas mixing conduits using only source gases from a plurality of said M gas distribution ducts delivered through said 1 to M gas inlet holes; and
- provides said gas mixture in a gas mixture stream from each of a plurality of said N gas mixing conduits to a substrate processing station without splitting said gas mixture stream.

9. The gas manifold of claim 8 wherein said gas manifold provides said gas mixture in a gas mixture stream from each of a plurality of said gas mixing conduits to a substrate processing station without combining said gas mixture stream with another gas stream.

10. The gas manifold of claim 9 wherein each of said N gas mixing conduits provides said gas mixture in a gas mixture stream from each of a plurality of said N gas mixing conduits to a semiconductor wafer processing station.

11. The gas manifold of claim 1 further comprising said 1 to N gas valves associated with each of said M gas distribution ducts, wherein each of said 1 to N gas valves associated with each of said M gas distribution ducts is a surface mounted valve.

12. The gas manifold of claim 1 wherein:
said gas mixing region in each of said N gas mixing conduits includes no welded joint.

13. The gas manifold of claim 1 wherein:
said gas mixing region in each of said N gas mixing conduits includes no threaded joint.

14. The gas manifold of claim 1 wherein:
said gas mixing region in each of said N gas mixing conduits includes only one flow channel, wherein said flow channel has no intersections with other gas flow channels.

15. The gas manifold of claim 1 wherein:
said third portion of said gas mixing region of at least one of said N gas mixing conduits has a serpentine shape.

16. The gas manifold of claim 1 wherein:
each of said M gas distribution ducts comprises only one flow channel, wherein said flow channel has no intersections with other gas flow channels.

17. The gas manifold of claim 1 wherein:
each of said N gas mixing conduits comprises only one flow channel, wherein said flow channel has no intersections with other gas flow channels.

* * * * *

UNITED STATES PATENT AND TRADEMARK OFFICE
CERTIFICATE OF CORRECTION

PATENT NO. : 8,291,935 B1  
APPLICATION NO. : 12/384623  
DATED : October 23, 2012  
INVENTOR(S) : Merritt et al.

Page 1 of 1

It is certified that error appears in the above-identified patent and that said Letters Patent is hereby corrected as shown below:

In the Specification

Col. 9, Line 60, Delete "660" and insert --390--

Col. 10, Line 17, After "mounting", delete "plate"

Col. 26, Line 57, Delete "631" and insert --632--

Col. 28, Line 33, Delete "an" and insert --and--

In the Claims

Col. 31, Line 22, In Claim 2, delete "duct." and insert --ducts.--

Col. 31, Line 25, In Claim 3, after "of", delete "a plurality"

Signed and Sealed this
First Day of October, 2013

Teresa Stanek Rea
*Deputy Director of the United States Patent and Trademark Office*